(12) United States Patent
Danby et al.

(10) Patent No.: US 7,116,197 B1
(45) Date of Patent: Oct. 3, 2006

(54) MAGNET STRUCTURE

(75) Inventors: Gordon Danby, Wading River, NY (US); John Jackson, Shoreham, NY (US); Raymond Damadian, Woodbury, NY (US); William H. Wahl, Smithtown, NY (US); Anthony Tenore, Yonkers, NY (US)

(73) Assignee: Fonar Corporation, Melville, NY (US)

( * ) Notice: Subject to any disclaimer, the term of this patent is extended or adjusted under 35 U.S.C. 154(b) by 0 days.

(21) Appl. No.: 10/834,771

(22) Filed: Apr. 29, 2004

Related U.S. Application Data

(63) Continuation of application No. 09/998,907, filed on Nov. 23, 2001.

(60) Provisional application No. 60/252,422, filed on Nov. 22, 2000.

(51) Int. Cl.
*H01F 7/00* (2006.01)

(52) U.S. Cl. ....................... 335/296; 335/299

(58) Field of Classification Search ......... 335/296–299
See application file for complete search history.

(56) References Cited

U.S. PATENT DOCUMENTS

| | | | |
|---|---|---|---|
| 4,672,346 A | 6/1987 | Miyamoto et al. | |
| 4,675,609 A | 6/1987 | Danby et al. | |
| 4,707,663 A | 11/1987 | Minkoff et al. | |
| 4,937,545 A | 6/1990 | Chaillout et al. | |
| 5,134,374 A | 7/1992 | Breneman et al. | |
| 5,283,544 A * | 2/1994 | Sakurai et al. | 335/297 |
| 6,150,911 A * | 11/2000 | Katznelson et al. | 335/299 |
| 6,157,278 A * | 12/2000 | Katznelson et al. | 335/296 |
| 6,313,632 B1 | 11/2001 | Aoki et al. | |
| 6,411,187 B1 * | 6/2002 | Rotem et al. | 335/296 |
| 6,429,761 B1 * | 8/2002 | Laskaris et al. | 335/229 |
| 6,452,472 B1 | 9/2002 | Aoki et al. | |
| 6,600,401 B1 * | 7/2003 | Zuk et al. | 335/299 |
| 6,650,214 B1 | 11/2003 | Aoki et al. | |
| 6,784,776 B1 | 8/2004 | Aoki et al. | |
| 6,794,973 B1 | 9/2004 | Aoki et al. | |
| 6,897,751 B1 | 5/2005 | Aoki et al. | |
| 2002/0097122 A1 * | 7/2002 | Rapoport | 335/304 |

\* cited by examiner

*Primary Examiner*—Elvin Enad
*Assistant Examiner*—Bernard Rojas
(74) *Attorney, Agent, or Firm*—IP Strategies

(57) ABSTRACT

A magnet structure produces a field within a magnet gap. The field is provided at least in part by a pair of permanent magnets that are fixed in place by a frame. The frame fixes a magnet assembly that is adapted to hold the magnetic material composing the permanent magnets, such that the quantity of the magnetic material can be adjusted to suit the particular application. The magnetic material can be provided in the form of discrete magnetic elements, such as magnetic "bricks". The frame also functions as the flux collector and return. Accordingly, the general geometry of the magnet structure is fixed, and the amount of magnetic material, and therefore the magnetic field strength, is adjustable.

130 Claims, 15 Drawing Sheets

MAGNET STRUCTURE

CROSS-REFERENCE TO RELATED APPLICATIONS

This is a continuation of co-pending U.S. patent application Ser. No. 09/998,907, which was filed on Nov. 23, 2001, and which in turn was based on U.S. Provisional Patent Application Ser. No. 60/252,422, filed on Nov. 22, 2000, which is incorporated herein in its entirety.

FIELD OF THE INVENTION

The present invention relates to magnet structures. In particular, the present invention relates to structures of magnets to be used for nuclear magnetic resonance imaging.

BACKGROUND OF THE INVENTION

Nuclear magnetic resonance imaging ("MRI") is utilized for scanning and imaging biological tissue as a diagnostic aid, and is one of the most versatile and fastest growing modalities in medical imaging. As part of the MRI process, the subject patient is placed in an external magnetic field. This field is created by a magnet assembly, which may be closed or open. Open magnet assemblies have two spaced-apart magnet poles separated by a gap, and a working magnetic field volume located within the gap. The magnetic field produced by the magnet is applied to the subject tissue, and the resulting nuclear magnetic resonance ("NMR") is read by a detector. The NMR data is then processed to produce an image of the tissue.

Conventionally, the elements of these imaging apparatus are sized and arranged to image an entire human body during a scan. Recently, scanning devices have been developed to facilitate imaging only a particular anatomical area of interest of the subject patient, rather than the patient's entire body. For example, such devices can be used to scan only an extremity or joint of the patient. The devices are designed such that the dimensions of the magnet gap accommodate the extremity, such as an arm or leg, or joint, such as an elbow, knee, wrist, or ankle.

Conventional extremity scanners, however, have a major drawback in that, due to design constraints, sufficient scanning field strength is not provided to adequately image the target body part. Typically, the usable field within the gap is provided at a strength of no greater than 0.2 tesla, which may limit some imaging applications. At least one design provides a larger field strength, but the structural design is such that weight-bearing scans are not possible, so the applications for this design are limited. In fact, most conventional designs require that an extremity to be scanned must be placed inside a small cylinder or other enclosed space. Most patients are uncomfortable and become fidgety when confined in this manner, making it more difficult to obtain meaningful diagnostic information.

There is therefore a need for a magnet structure design that has dimensions suitable for use in imaging an extremity or particular portion of a subject's body, while still providing a field strength within the magnetic field volume that will allow for clear imaging of the subject tissue. The design should provide ample room for the extremity so that the patient is comfortable. The magnet structure should also be constructed such that it can enable weight-bearing scans, providing even more diagnostic flexibility.

BRIEF SUMMARY OF THE INVENTION

The present invention is a magnet structure that can be used in many imaging applications, and has features that make it particularly suitable for use when constructed on a relatively small scale, so that bodily extremities can be scanned. The field within the magnet gap is provided at least in part by a pair of permanent magnets that are fixed in place by a frame. The frame or a magnet assembly is adapted to fix in place the magnetic material composing the permanent magnet, preferably such that the quantity of the magnetic material can be adjusted to suit the particular application. Thus, the general geometry of the magnet structure is fixed, and the amount of magnetic material, and therefore the magnetic field strength, is adjustable. By providing an appropriate amount of magnetic material, and by selecting magnetic material having adequate energy properties, the field strength is suitable for the scanning application.

The structural design of the present invention allows for scanning of extremities such as feet, ankles, hands, and wrists, as well as knees, elbows, and upper legs and arms. The structure also can support at least a portion of a patient's body weight, allowing for weight-bearing scans. Accommodation can be made for the patient's leg such that even hips can be scanned.

According to an exemplary aspect of the present invention, a magnet structure includes a frame supporting first and second opposing permanent magnet assemblies. The frame includes a base, first and second extensions connected to the base and to the respective first and second opposing permanent magnet assemblies, and first and second support structures supporting the respective first and second opposing permanent magnet assemblies with respect to the base. The first and second opposing permanent magnet assemblies each include an enclosure having an open end, a pole face disposed on the enclosure and arranged such that it faces the pole face of the other permanent magnet assembly, a magnetic mass disposed within the enclosure, and a cover over the open end of the enclosure.

The magnetic mass can be a plurality of bricks made from a first magnetic material, and the enclosure can be box-shaped. The bricks can be stacked so as to substantially conform to the shape of the enclosure and fill the enclosure. The magnet structure can also include a brace connected between the cover and a first side of the enclosure on which the pole face is disposed. Alternatively, or in addition, the magnet structure can also include a brace connected between a first side of the enclosure, and a second side of the enclosure on which the pole face is disposed. The bricks can include main bricks oriented so as to direct a main magnetic field in a first direction, and bucking bricks oriented to direct a blocking magnetic field in a second direction.

The main bricks can be disposed behind the respective pole face and direct the main magnetic field generally toward the respective pole face, and the bucking bricks can be disposed to one side of an outside periphery of the respective pole face and direct the blocking magnetic field toward a center line of the respective pole face. Alternatively, the main bricks can be disposed behind the respective pole face and direct the main magnetic field generally toward the respective pole face, and the bucking bricks can be disposed on two opposite sides of an outside periphery of the respective pole face and direct the blocking magnetic field toward a center line of the respective pole face. As another alternative, the main bricks can be disposed behind the respective pole face and direct the main magnetic field generally toward the respective pole face, and the bucking bricks can include first bucking bricks and second bucking bricks. In this case, the first bucking bricks are disposed at a first side of an outside periphery of the respective pole face and direct the blocking magnetic field toward a first center line of the respective pole face, and the second bucking bricks are disposed at a second side of the outside periphery of the respective pole face, adjacent the first side of the outside periphery of the respective pole face, and direct the blocking magnetic field toward a second center line of the respective pole face. Alternatively, the main bricks can be disposed behind the respective pole face and direct the main magnetic field generally toward the respective pole face, and the bucking bricks can include first bucking bricks and second bucking bricks. In this case, the first bucking bricks are disposed at first and second opposite sides of an outside periphery of the respective pole face and direct the blocking magnetic field toward a first center line of the respective pole face, and the second bucking bricks are disposed at third and fourth opposite sides of the outside periphery of the respective pole face, adjacent the first and second opposite sides of the outside periphery of the respective pole face, and direct the blocking magnetic field toward a second center line of the respective pole face.

An orientation of each brick can determine a direction of the magnetic field produced by that brick. For example, the orientation of each brick can be selected to direct a cumulative magnetic field produced by the plurality of bricks, for example, toward the respective pole face. Alternatively, the orientation of a first quantity of the plurality of bricks can be selected to direct a cumulative magnetic field produced by the first quantity of bricks generally toward the respective pole face, and the orientation of a second quantity of the plurality of bricks can be selected to focus the cumulative magnetic field produced by the first quantity of bricks toward a particular area of the respective pole face.

The magnetic mass can be selected from a group of materials consisting of rare earth metals. The dimensions of each brick can be adjusted to suit the geometry required of the application, such as approximately 2 inches by 2 inches by 1 inch.

The frame can also include first and second slabs of magnetic material disposed on sides of the respective enclosures of the opposing permanent magnet assemblies opposite the sides of the respective enclosures on which the pole faces are disposed. The first and second frame extensions can also be made from a magnetic material.

According to another aspect of the present invention, a magnet structure includes a first permanent magnet mass, a first pole face disposed on the first permanent magnet mass, a second permanent magnet mass, a second pole face disposed on the second permanent magnet mass, and a frame connecting the first permanent magnet mass to the second permanent magnet mass. The first pole face is substantially opposite and facing the second pole face to define a magnetic field volume in a gap located between the first pole face and the second pole face. The magnetic fields produced by the first and second permanent magnet masses can be directed toward the respective pole faces.

The first and second permanent magnetic masses can be respective first and second pluralities of bricks made of magnetic material, which can consist of rare earth metals. The first and second pluralities of bricks can have geometries that allow a magnetic field direction for each brick to be selected by physical arrangement of the brick. The first and second pluralities of bricks can be arranged so that a cumulative effect of individual field directions of the bricks is a magnetic field directed toward the respective pole face.

Each of the first and second pluralities of bricks can include main bricks oriented so as to direct a main magnetic field in a first direction, and bucking bricks oriented to direct a blocking magnetic field in a second direction.

The main bricks can be disposed behind the respective pole face and direct the main magnetic field generally toward the respective pole face, and the bucking bricks can be disposed to one side of an outside periphery of the respective pole face and direct the blocking magnetic field toward a center line of the respective pole face. Alternatively, the main bricks can be disposed behind the respective pole face and direct the main magnetic field generally toward the respective pole face, and the bucking bricks can be disposed on two opposite sides of an outside periphery of the respective pole face and direct the blocking magnetic field toward a center line of the respective pole face. As another alternative, the main bricks can be disposed behind the respective pole face and direct the main magnetic field generally toward the respective pole face, and the bucking bricks can include first bucking bricks and second bucking bricks. In this case, the first bucking bricks can be disposed at a first side of an outside periphery of the respective pole face and direct the blocking magnetic field toward a first center line of the respective pole face, and the second bucking bricks can be disposed at a second side of the outside periphery of the respective pole face, adjacent the first side of the outside periphery of the respective pole face, and direct the blocking magnetic field toward a second center line of the respective pole face. Alternatively, the main bricks can be disposed behind the respective pole face and direct the main magnetic field generally toward the respective pole face, and the bucking bricks can include first bucking bricks and second bucking bricks. In this case, the first bucking bricks can be disposed at first and second opposite sides of an outside periphery of the respective pole face and direct the blocking magnetic field toward a first center line of the respective pole face, and the second bucking bricks can be disposed at third and fourth opposite sides of the outside periphery of the respective pole face, adjacent the first and second opposite sides of the outside periphery of the respective pole face, and direct the blocking magnetic field toward a second center line of the respective pole face.

The magnet structure may also include first and second enclosures in which the first and second pluralities of bricks are respectively disposed, wherein the first and second enclosures are connected to the frame and to the respective first and second pole faces. Each enclosure can include an open end for inserting and removing quantities of the respective pluralities of bricks, and a cover disposed over the open end. Each enclosure can also include a brace connected between the cover and a first side of the enclosure on which the pole face is disposed. Alternatively, or in addition, each enclosure can also include a brace connected between a first side of the enclosure, and a second side of the enclosure on which the pole face is disposed.

Each permanent magnetic mass can include a main magnetic mass providing a main magnetic field in a first direction, and a focusing magnetic mass providing a main magnetic field in a second direction. The first direction can be normal to a plane generally defined by a shape of the pole face, and the second direction can be parallel to the plane generally defined by a shape of the pole face. The magnetic mass can include magnetic material selected from group consisting of rare earth metals.

The magnetic mass can include discrete magnetic elements, which can include magnetic material selected from group consisting of rare earth metals. A selectable orientation of each discrete magnetic element can determine a direction of the magnetic field produced by that discrete magnetic element. The orientation of each discrete magnetic element can be selected to direct a cumulative magnetic field produced by the discrete magnetic elements toward the respective pole face. The orientation of a first quantity of the discrete magnetic elements can be selected to direct a cumulative magnetic field produced by the first quantity of discrete magnetic elements generally toward the respective pole face, and the orientation of a second quantity of the discrete magnetic elements can be selected to focus the cumulative magnetic field produced by the first quantity of discrete magnetic elements toward a particular area of the respective pole face. The particular area of the pole face can include the center of the pole face. The first quantity of the discrete magnetic elements can be disposed behind the respective pole face, and the second quantity of the discrete magnetic elements can be disposed outside of an outer peripheral edge of the respective pole face.

The frame can also include first and second slabs of magnetic material disposed on sides of the respective first and second permanent magnet masses opposite the sides of the respective permanent magnet masses on which the respective pole faces are disposed.

According to another exemplary aspect of the present invention, a magnet structure includes a frame, including first and second opposing frame ends and a plurality of spacers separating the first and second frame ends, a first permanent magnet assembly, attached to the first frame end, and a second permanent magnet assembly, attached to the second frame end. The first permanent magnet assembly includes a first magnet enclosure, a first permanent magnet insert, and a first pole face disposed on an end of the first magnet enclosure. Likewise, the second permanent magnet assembly includes a second magnet enclosure, a second permanent magnet insert, and a second pole face disposed on an end of the second magnet enclosure. The first and second frame ends can be made substantially of iron.

Each of the first and second magnet enclosures can include a retainer, and a support connecting the retainer to the respective frame end, such that the respective permanent magnet insert is held between a first side of the retainer and the respective frame end, and the respective pole face is attached to a second side of the retainer. The retainers can be made substantially of iron.

Each of the ends can be shaped substantially like a cross. The cross shape can be supported by at least one gusset. The spacers can connect corresponding ends of the cross shapes of the first and second frame ends.

The first and second magnet enclosures can each include an open end, a closed end, and a sidewall, defining an inside space in which the respective permanent magnet insert is disposed. The first and second magnet enclosures can each be attached to the respective frame end such that the open end is in direct communication with the respective frame end, and the respective pole face is attached to the closed end. Each inside space can have a plan view that is shaped substantially like a rectangle. If the first and second frame ends are each shaped substantially like a cross, the sides of each of the inside spaces can be substantially parallel with arms of the respective cross. Alternatively, the corners of each of the inside spaces can be disposed on arms of the respective cross. The first and second magnet enclosures can be made substantially of iron.

The magnet first and second permanent magnet inserts can each include discrete magnetic elements. The discrete magnetic elements can be made of magnetic material, such as that selected from group consisting of rare earth metals. The discrete magnetic elements can have geometries that allow a magnetic field direction for each discrete magnetic element to be selected. The discrete magnetic elements can be arranged so that a cumulative effect of individual field directions of the discrete magnetic elements is a magnetic field directed toward the respective pole face. The discrete magnetic elements can include a first group of discrete magnetic elements arranged to have a magnetic field directed generally toward the respective pole face, and a second group of discrete magnetic elements focusing the magnetic field toward a particular area on the respective pole face. The particular area on the respective pole face can be the center of the pole face. The second group of discrete magnetic elements can be disposed between the first group of discrete magnetic elements and the respective pole face and outside an outer periphery of the respective pole face, and the second group of discrete magnetic elements can produce a magnetic field that has a direction substantially parallel to the pole face.

The first and second permanent magnet inserts can each include bricks made of magnetic material. The bricks can be made of magnetic material selected from group consisting of rare earth metals. The bricks can have geometries that allow a magnetic field direction for each said brick to be selected by physical arrangement of the brick. The bricks can be arranged so that a cumulative effect of individual field directions of the bricks is a magnetic field directed toward the respective pole face. The bricks can include a first group of bricks arranged to have a magnetic field directed generally toward the respective pole face, and a second group of bricks focusing the magnetic field toward a particular area on the respective pole face. The particular area on the respective pole face can be an area including the center of the pole face. The second group of bricks can be disposed between the first group of bricks and the respective pole face and outside an outer periphery of the respective pole face, and the second group of bricks can produce a magnetic field that has a direction substantially parallel to the pole face.

Thus, the magnet structure is characterized by two opposing poles that are substantially parallel to each other. For example, the poles can be facing each other across an air gap, oriented in a vertical position so that the magnetic field produced by the magnet is horizontal. The poles are made of magnetic material, typically ferromagnetic material. A magnetic mass is disposed behind the poles to provide the magneto-motive force. As described above, the magnetic mass can be composed of discrete magnetic elements, such as magnetic bricks, that is, a discrete magnetic element having a thick, tile shape. These bricks can be stacked in an array to form the permanent magnet.

A flux collection plate, formed from a magnetic material, such as a ferromagnetic material, is disposed behind each magnetic mass. At least one ferromagnetic conductor connects the flux collection plates, in order to minimize the magnetic reluctance between the permanent magnets.

DETAILED DESCRIPTION OF THE INVENTION

Figure 1:
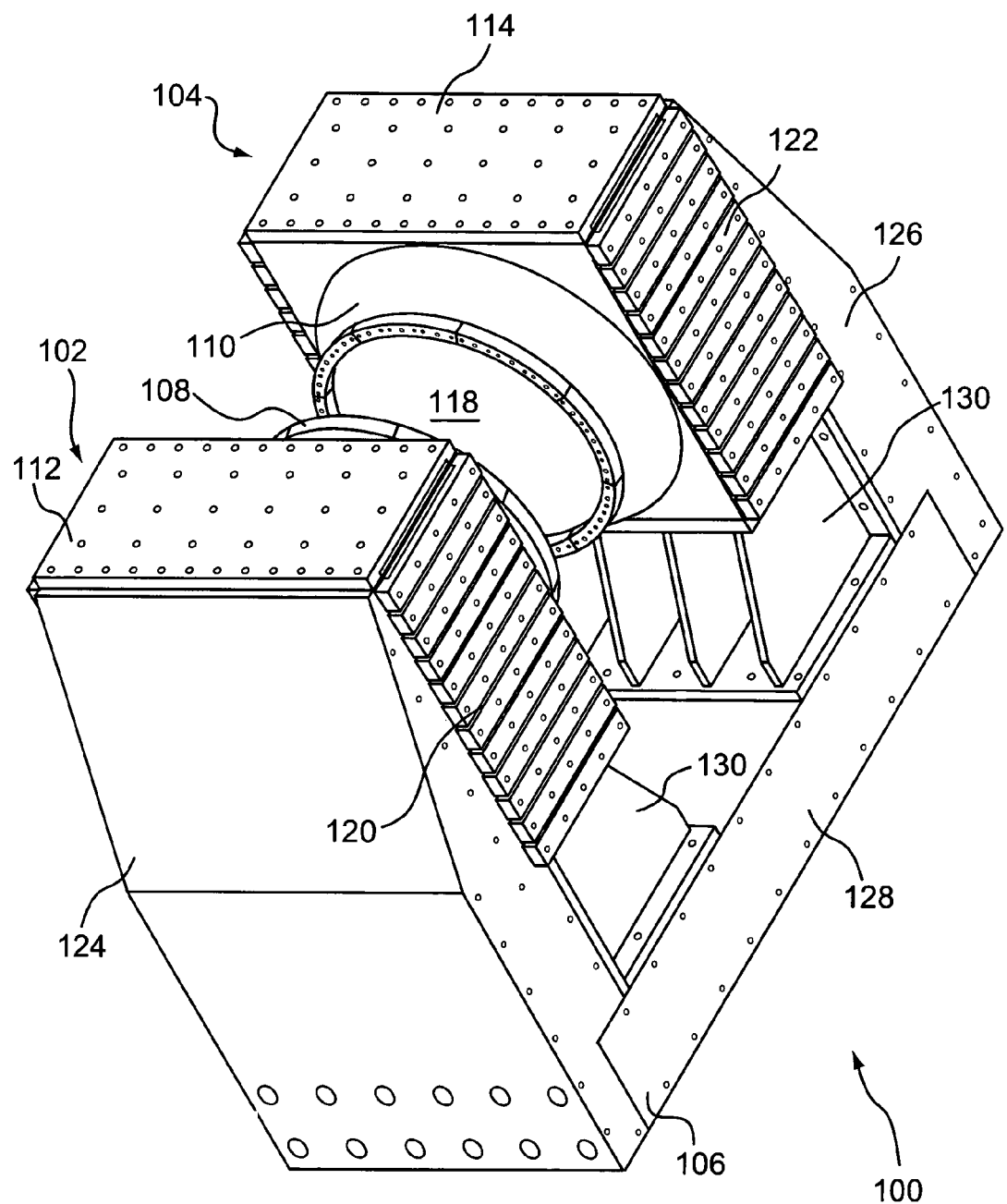
FIG. 1 is an isometric view of an embodiment of the magnet structure of the present invention.

The present invention is a magnet structure that is particularly advantageous for use in scanning a patient in a nuclear MRI procedure, as described above. Two permanent magnet assemblies are provided, one on each side of a gap that is designated the working magnetic field volume. The structure includes two opposing, substantially parallel poles, one each as a part of a respective magnet assembly. Preferably, the poles are substantially composed of a ferromagnetic material.

The permanent magnet assemblies include a mass of magnetic material disposed behind each pole, that is, away from the gap between the poles, to provide the magnetomotive force for the magnet structure. The magnetic material can be, for example, rare earth metals, which are elements of the lanthanide series, atomic numbers 57 through 71. According to the present invention, the magnetic material can take the form of discrete magnetic elements, such as thick, tile-shaped "bricks", or arcuate polar elements. The discrete elements can be assembled in an array.

In exemplary embodiments, each pole is efficiently coupled to a respective magnetic mass for flux transfers via a collector interface. The collector interface can be circular or rectangular, or can smoothly transition in shape such that it matches the pole shape and the shape of the magnetic mass at each respective contact area. The collector interface in an exemplary embodiment includes a ferromagnetic collector plate in intimate contact with the surface of the permanent magnet stack. Ideally, the collector plate is in contact with the permanent magnet stack over the entire surface of the collector plate. If this is not possible, it is contemplated that the contact area is preferably maximized. Alternatively, an air gap for providing symmetry can be located between the collector interface and the rear of the pole.

In an exemplary embodiment, the pole is cylindrical. Alternatively, the pole can be elongated either vertically or horizontally to correspondingly elongate the scanning volume in a selected dimension. The pole surface can be contoured to produce a uniform scanning field volume.

According to at least one embodiment of the present invention, the poles have surfaces that are parallel and are aligned substantially vertically, so that the direction of the produced magnetic field is horizontal. In at least one other exemplary embodiment, the poles have surfaces that are parallel and are aligned substantially horizontally, so that the direction of the produced magnetic field is vertical. Except where a particular orientation of the magnet structure is specified to facilitate describing an exemplary embodiment that is suited for a particular application, it is to be assumed that no particular orientation is specified for the structure of the present invention. That is, unless specifically noted otherwise for a particular exemplary embodiment, no particular portion of the structure is designated as the front, back, side, top, or bottom, except in relation to other portions and components.

A ferromagnetic flux collector plate is disposed behind each permanent magnet mass, that is, on the side of the brick stack that is farthest from the pole. In one exemplary embodiment, the flux collector plate is disposed directly in contact with the permanent magnet mass. Alternatively, a small air gap is provided between the flux collector plate and the magnetic mass, to compensate for any asymmetry of the flux return. One or more preferably ferromagnetic conductors connect the two flux collector plates, in order to minimize the reluctance that occurs in the flux return connecting the rears of the two permanent magnet masses. In at least one exemplary embodiment, the connecting flux return is located below the permanent magnet masses, such as under a floor on which the magnet structure is at rest. According to at least one other exemplary embodiment, the connecting flux return is located on a side of the permanent magnet masses, behind the working magnetic field volume. Two connecting flux returns can be utilized, one each in the exemplary locations described above.

In order to obtain good results from a scan, the field strength in the magnet gap must be sufficiently large, so that meaningful data can be provided. The diagnostic utility of scanning data increases with the field strength in the magnet gap, that is, within the working volume of the scanner. Thus, it is advantageous to maximize the field strength in the magnet gap, given certain physical constraints, such as magnet structure dimensions and availability of magnetic material. Many factors can affect the field strength in the magnet gap. For example, the strength, that is, the energy product BH of the permanent magnet, times the volume of the permanent magnet material, play a large part in determining the field strength in the magnet gap. While increasing the amount of magnetic material will certainly increase the field strength, size limitations on the magnet structure can limit the amount of magnetic material used. Obviously, obtaining better quality magnetic material will also cause an increase in field strength, but obtaining better material drives up the cost of the magnet structure. Certain design considerations can be applied, however, to increase the usable field strength, even while constrained by the quantity and quality of the magnetic material.

For example, optimizing the flux collection and its transfer into the useful gap region also affects the field strength in the gap. Such optimization is provided by the magnet structure as described above. In addition, directing the field at the poles so that it is more focused within the gap makes the available field strength more useful. This can be accomplished according to the present invention by dividing the permanent magnetic mass into portions that are oriented so as to focus the field produced by the magnetic mass. For example, a main magnetic mass can direct the field generally toward the pole, and secondary magnetic masses can be oriented so as to direct, or focus, the main field such that the overall field produced is concentrated in a manner that is more efficient for scanning tissue within the working field volume. In an embodiment using arrays of magnetic bricks as the magnetic mass, for example, a main stack of these bricks disposed behind the pole and behind the collector interface, functioning as the main magnetic mass described above. Additional stacks of "blocking" bricks can be arranged around at least a portion of the periphery of the pole and/or collector interface, functioning as the secondary magnetic mass described above. The efficiency provided by the secondary magnetic mass adds to the effective field strength produced by the magnet.

Thus, an open space leading to the working field volume between the poles is provided for a patient, such that the patient can project the subject tissue in the working field volume. Because of the combination of the structural elements of the present invention, and the improved strength and efficiency of the working field due to the functional considerations of the present invention, the patient and diagnostician are provided with added flexibility in performing the scan. Not only can a patient extend an unsupported extremity into the working field volume, he or she can also support at least a portion of his or her weight on the subject extremity. For example, a patient having an ankle or knee scanned can be seated in front of the scanner and project his or her leg horizontally into the gap. In a subsequent scan, the patient can stand between the poles, enabling a weight-bearing condition that provides different and insightful information, increasing the likelihood of a successful diagnosis. The geometry and field strength of the structure of the present invention enables a variety of scanning scenarios that are at best difficult to set up using conventional scanners. For example, a patient can also lie horizontally in front of the scanner and project his or her head into the working volume for scanning.

Another exemplary embodiment of the present invention is a symmetric, multiple-post "open" magnet structure, particularly suitable for use as part of an MRI whole body scanner. The exemplary embodiment utilizes four posts and a vertical field. The posts, preferably ferromagnetic, function as flux returns between two ferromagnetic end plates. For ease of explanation only, the two end plates will be oriented and referred to as top and bottom plates. A permanent magnet mass is disposed below the top plate. Flux collector regions and a magnet pole are arranged below the permanent magnet mass. The bottom half of the structure is symmetrically identical to the top half, about a horizontal line that runs midway between the two opposing, substantially parallel poles. Because of the flux return posts spacing the top and bottom end plates, the magnetic flux generated by the upper and lower permanent magnets cross the scanning gap and return with a minimum of reluctance.

In an exemplary embodiment, each permanent magnet mass is an array of discrete magnetic elements, which can be, for example, a stack of magnetic bricks as described above. Further, these brick stacks can be arranged so as to have rectangular cross sections, and can be disposed in a container volume located between an end plate and a flux collector region. That is, a ferromagnetic flux collector is supported below the top plate to define a container volume to be filled with permanent magnet elements. A similar volume is defined above the bottom plate. An auxiliary small compartment around the periphery of the flux collector can be used to stack with blocking bricks to increase efficiency of the magnet structure.

Similar to previously-described embodiments, the poles are preferably cylindrical. A collector interface can be provided between the rear of the pole and the matching surface of the flux collector, to increase the efficiency of coupling between the pole and the flux collector. For example, such a collector interface can be used to efficiently magnetically couple a square flux collector surface to a circular pole surface.

Particular exemplary embodiments of the present invention are described in more detail below. These exemplary embodiments are illustrative of the inventive concept described above and recited in the appended claims, and are not limiting of the scope or spirit of the present invention as contemplated by the inventors.

First Exemplary Embodiment

A first exemplary embodiment of the invention is shown in FIGS. 1-6. FIG. 1 is an isometric view of the magnet structure 100 of this exemplary embodiment. The magnet structure 100 includes a pair of magnet assemblies 102, 104, and a frame 106, which provides support for the first and second magnet assemblies 102, 104 and maintains a fixed distance between them. Although the frame 106 satisfies structural requirements of the magnet structure 100, certain components of the frame 106 can perform functional roles as well.

Figure 3:
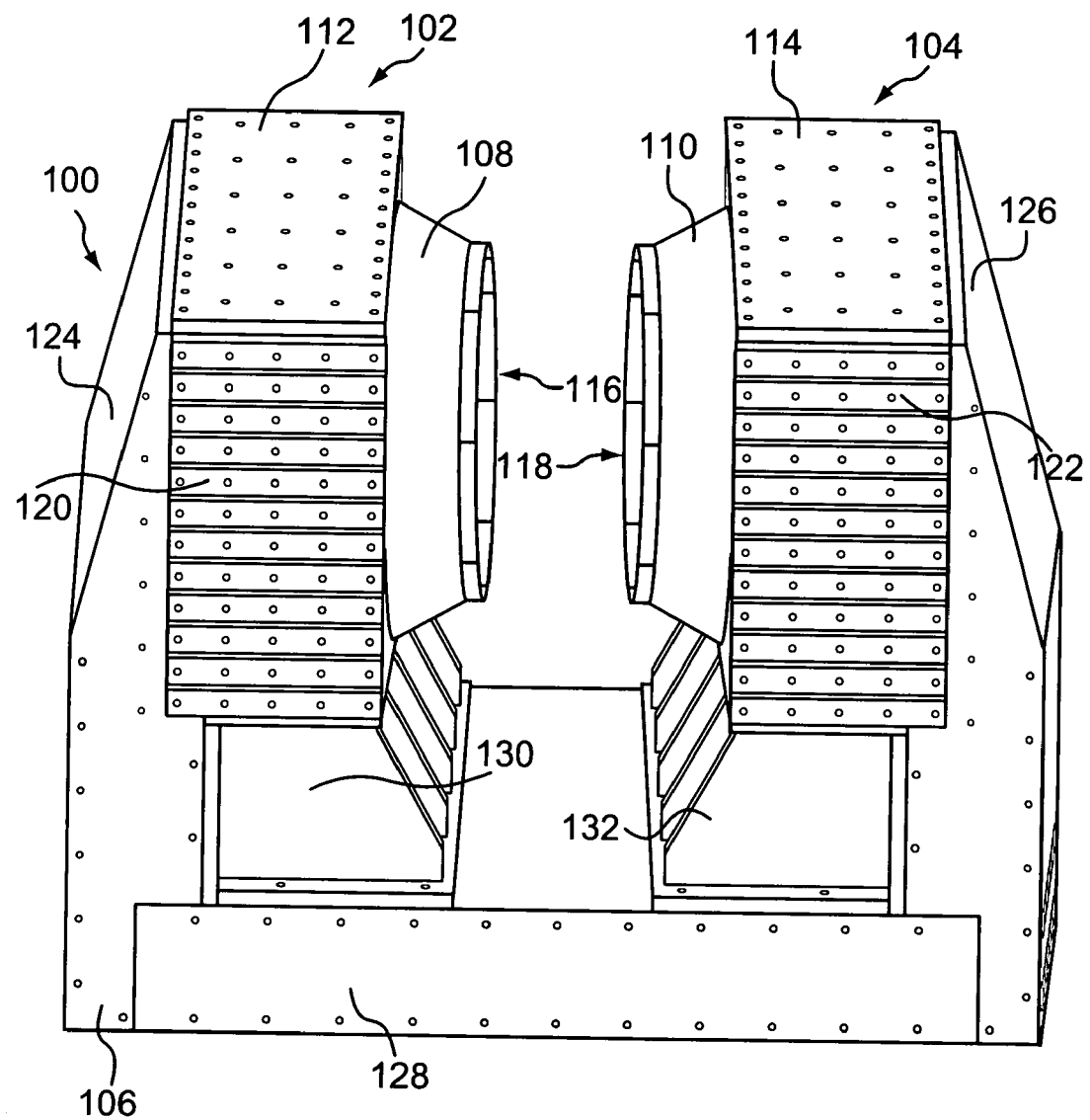
FIG. 3 is a top/front isometric view of the embodiment shown in FIG. 1.

The first and second magnet assemblies 102, 104 include respective first and second poles 108, 110 and respective first and second magnet enclosures 112, 114. As shown in FIG. 3, the poles 108, 110 are disposed on opposing sides of the magnet enclosures 112, 114, such that faces 116, 118 of the poles 112,114 are substantially parallel and facing each other. The magnet enclosures 112, 114 are filled with magnetic material, which is the magnetic mass that provides the magneto-motive force of the permanent magnet. Each magnet enclosure 112, 114 has an opening through which the magnetic material can be placed into the magnet enclosure and taken out of the magnet enclosure. The magnetic material can take the form of, for example, discrete magnetic elements. These discrete magnetic elements can take any of various forms, such as that of bricks, that is, oblong rectangular shapes, or, alternatively, thin, square, tile-shaped bricks. Alternatively, the discrete magnetic elements can be arcuately shaped, and stacked within the magnet enclosure to form a round magnetic mass. The interior of the magnet enclosures 112, 114 can be shaped to accommodate discrete magnetic elements of any shape. First and second covers 120, 122 are provided over the respective openings. The covers 120, 122 can be composed of discrete covering pieces, such as strips of material spanning the opening.

The magnetic material can be substantially composed of, for example, any of the rare earth metals, either alone or in any combination. The magnet enclosures 112, 114 are made from one or more magnetic materials, such as a ferromagnetic material. The poles 108,110 are made from one or more magnetic materials, such as a ferromagnetic material. The covers 120, 122 are made from a sufficiently strong structural material that is not magnetic, such as aluminum.

Figure 2:
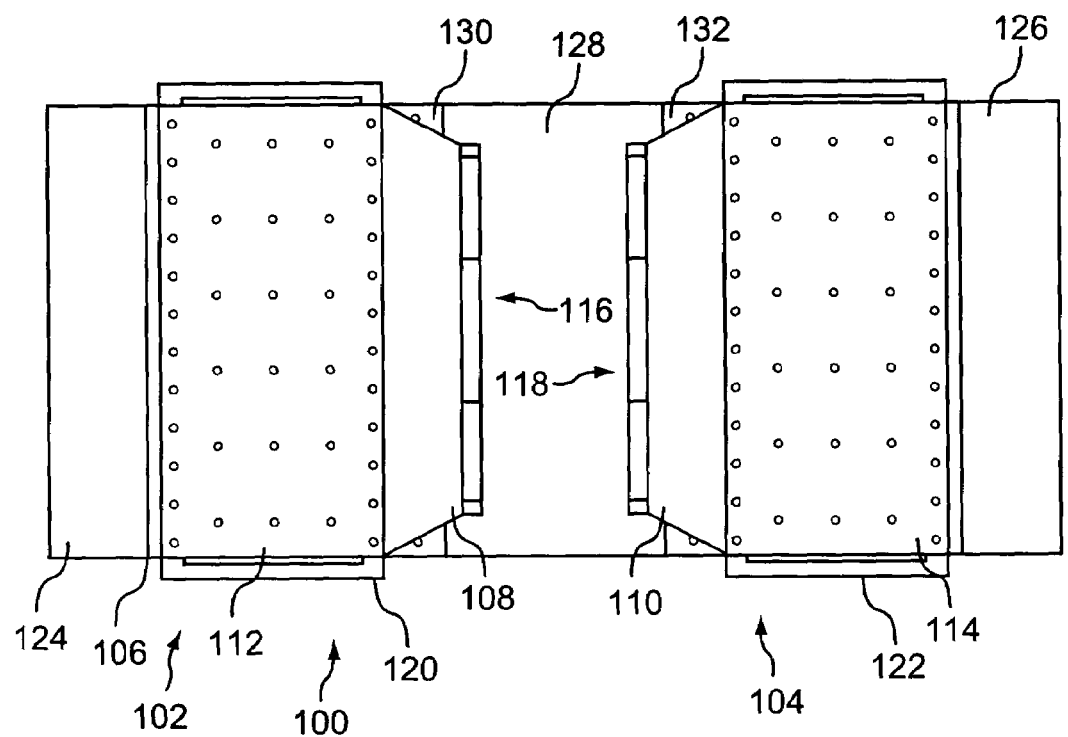
FIG. 2 is a front elevation view of the embodiment shown in FIG. 1.
Figure 4:
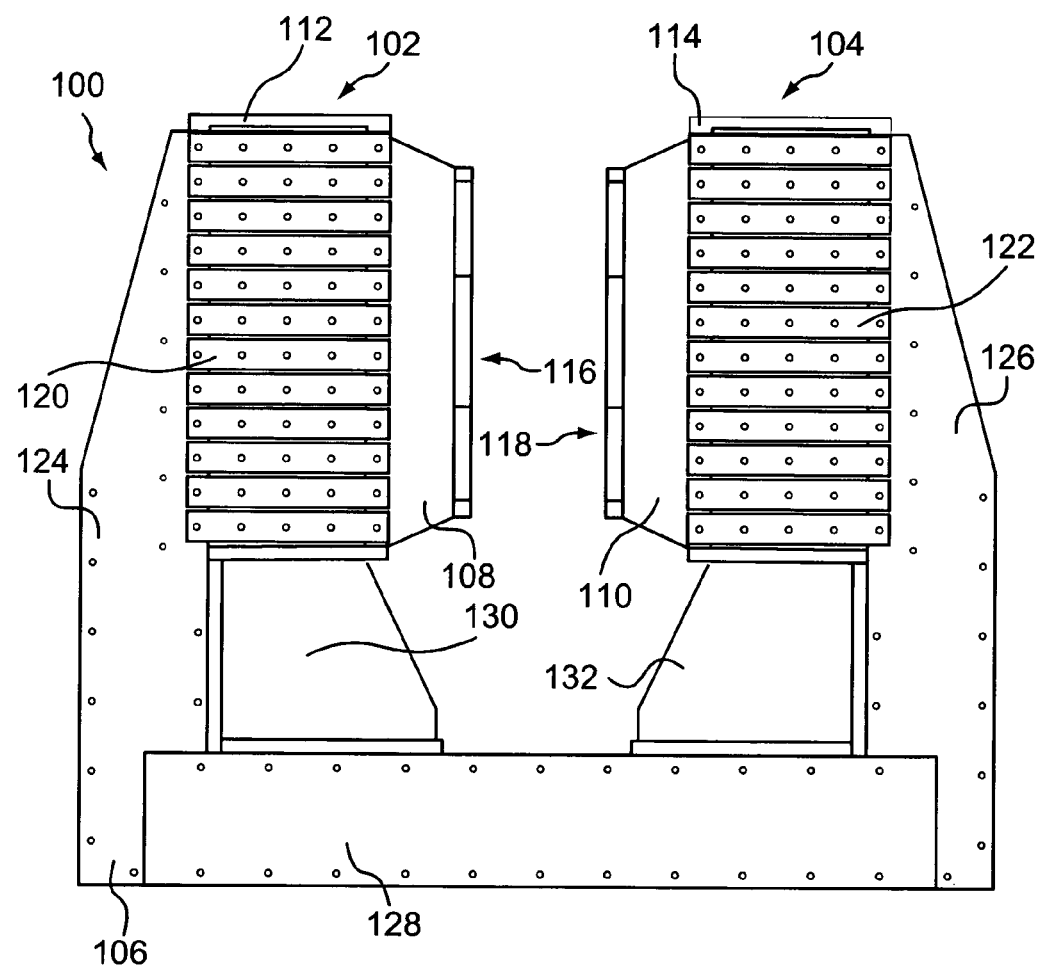
FIG. 4 is a top plan view of the embodiment shown in FIG. 1.
Figure 5:
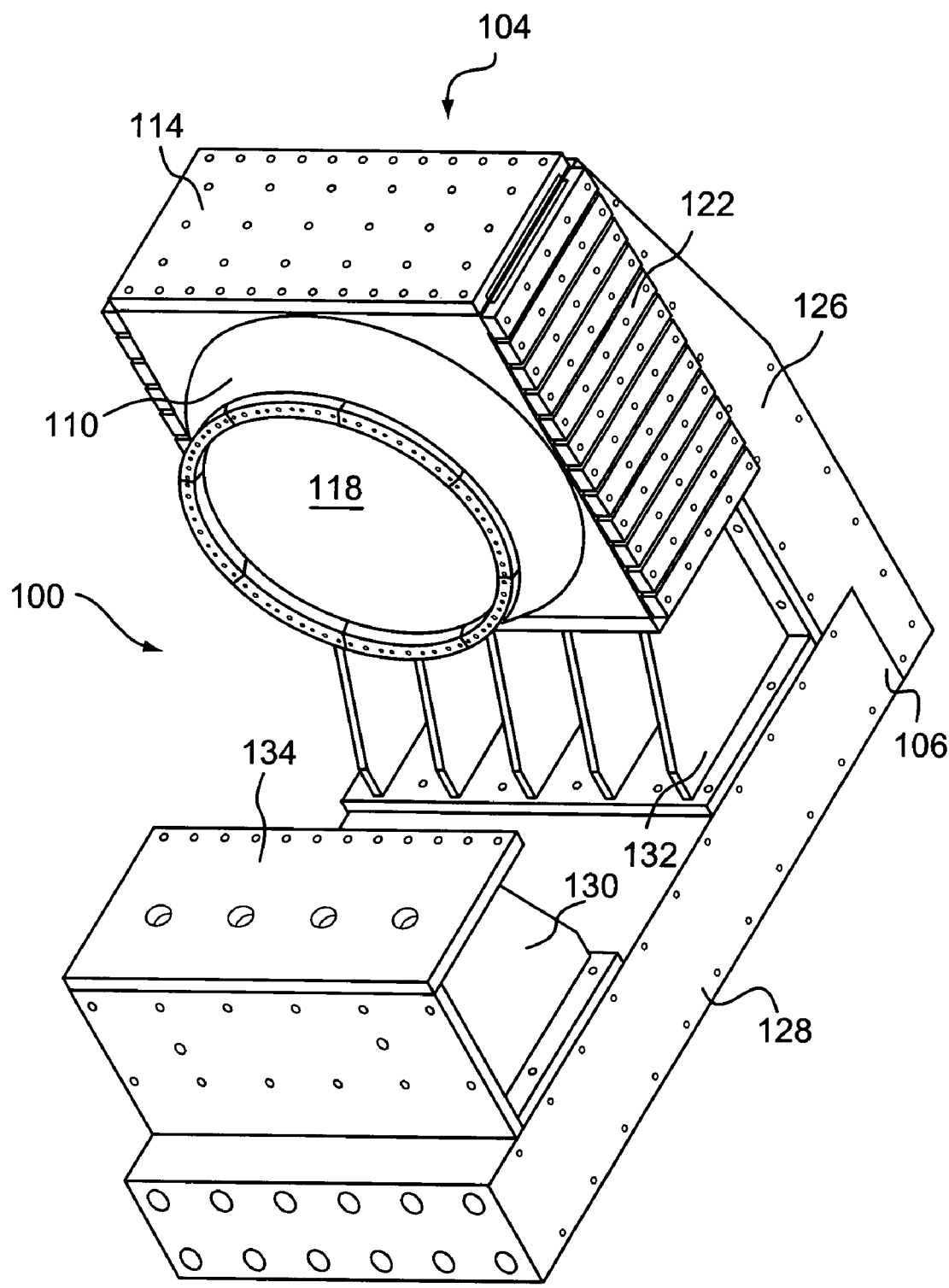
FIG. 5 is an isometric view of the embodiment shown in FIG. 1, with one of the magnet assemblies removed.

The frame 106 includes first and second end plates 124, 126 connected to the respective magnet enclosures 112, 114, a connecting element 128 joining the end plates 124, 126, and first and second support gussets 130, 132, acting as braces between the connecting element 128 and the respective magnet enclosures 112, 114. To provide sufficient stability, the gussets 130, 132 can be attached to the first and second end plates, 124, 126, the magnet enclosures 112, 114, and the connecting element 128. Structurally, the frame 106 keeps the magnet assemblies 102,104 stationary and spaced at a selected distance. The structure of the frame 106 also maintains the relative orientation of the poles 108, 110, such that the pole faces 116, 118 are opposed and substantially parallel, as shown in FIGS. 2 and 4. Strictly in respect of the structural requirements of the frame 106, the end plates 124, 126, connecting element 128, and support gussets 130, 132 are made of strong stiff material, such as metal. The support gussets 130, 132 preferably are made from a non-magnetic metal, such as aluminum. As shown in FIG. 5, the gussets 130, 132 can include gusset platforms 134, to provide additional stability in bracing the magnet assemblies 102, 104. Whether the end plates 124, 126 and connecting element 128 are made from a magnetic metal, and particularly from a ferromagnetic material, depends on the functionality required of these frame components, as described below.

Figure 6:
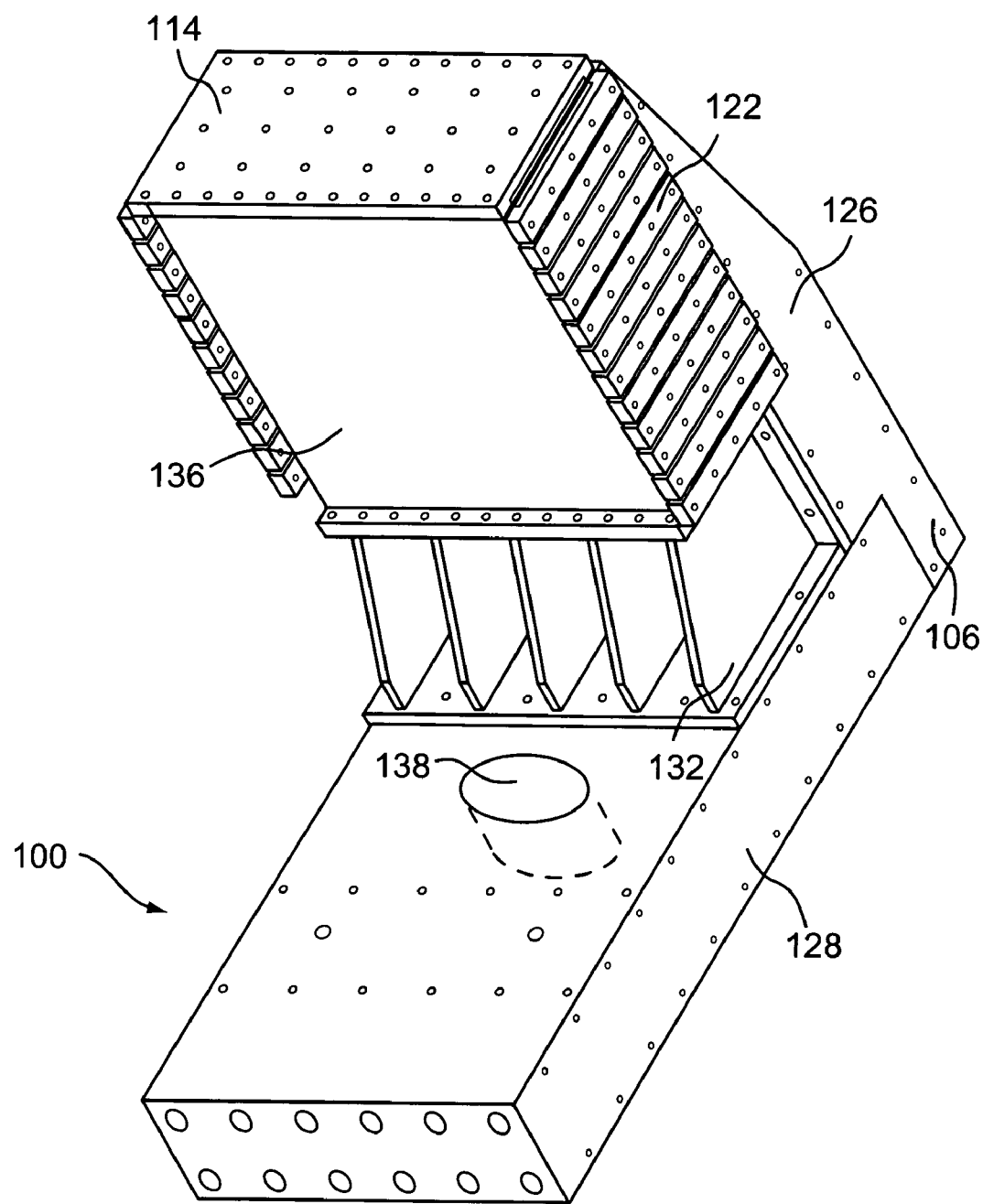
FIG. 6 is an isometric view of the embodiment shown in FIG. 1, with one of the magnet assemblies removed and the other magnet pole face removed.

Functionally, the end plates 124, 126 can act as flux collector plates. In such cases, the end plates 124, 126 are made from a magnetic material, preferably a ferromagnetic material, and a portion of each end plate 124, 126 facing the respective magnet enclosure 112, 114 is proximate to the magnetic material, and preferably is in contact with the magnetic material. This contact can be made either directly or, as shown in FIG. 6, through mutual contact with an interface element 136 made of a magnetic material, such as a ferromagnetic material. Likewise, the connecting element 128 can function as a flux return between the flux connector plates. In such cases, the connecting element 128 is made from a magnetic material, preferably a ferromagnetic material. The connecting element can include a bore 138, through which a patient can place his or her leg, so that the patient's leg can be placed within the gap for scanning.

Second Exemplary Embodiment

FIGS. 7-10 illustrate a second exemplary embodiment of the magnet structure 200 of the present invention. As in the first embodiment, the magnet structure 200 includes a pair of magnet assemblies 202, 204, and a frame 206, which provides support for the first and second magnet assemblies 202, 204 and maintains a fixed distance between them. Although the frame 206 satisfies structural requirements of the magnet structure 200, certain components of the frame 206 can perform functional roles as well.

Figure 7:
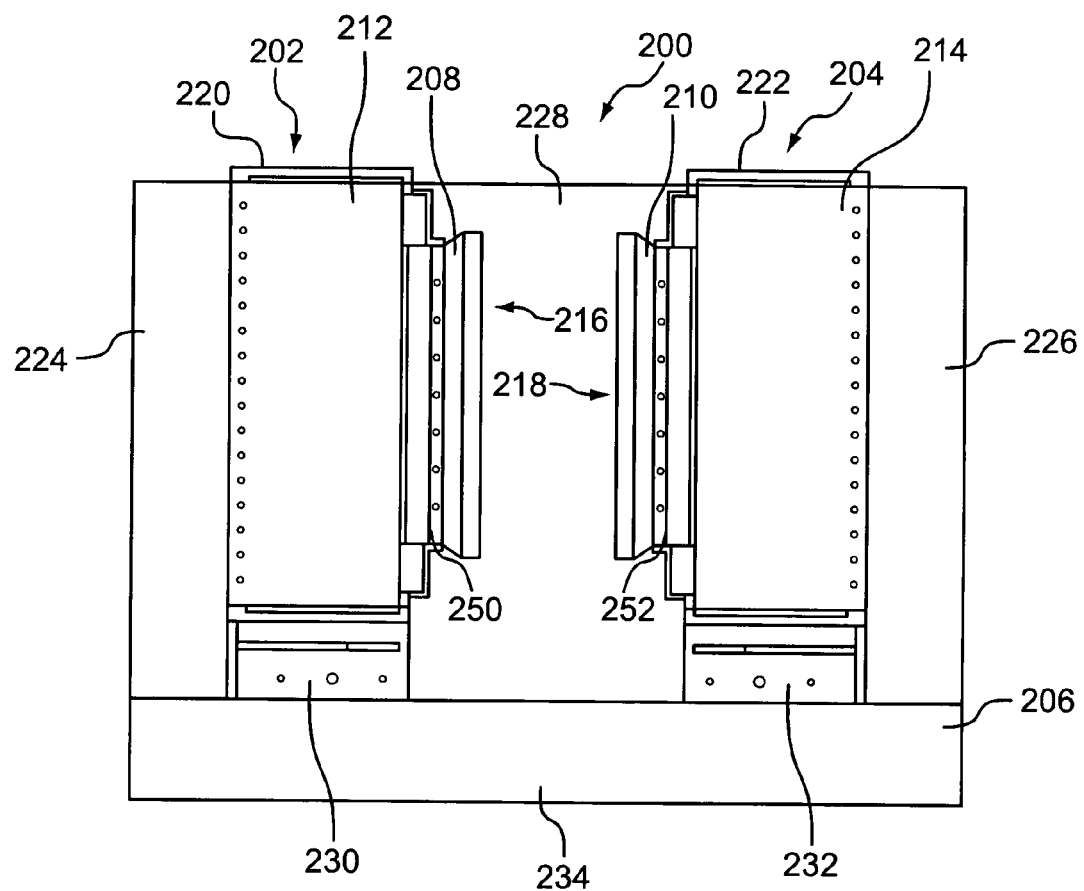
FIG. 7 is a front view of an alternative embodiment of the magnet structure of the present invention.
Figure 8:
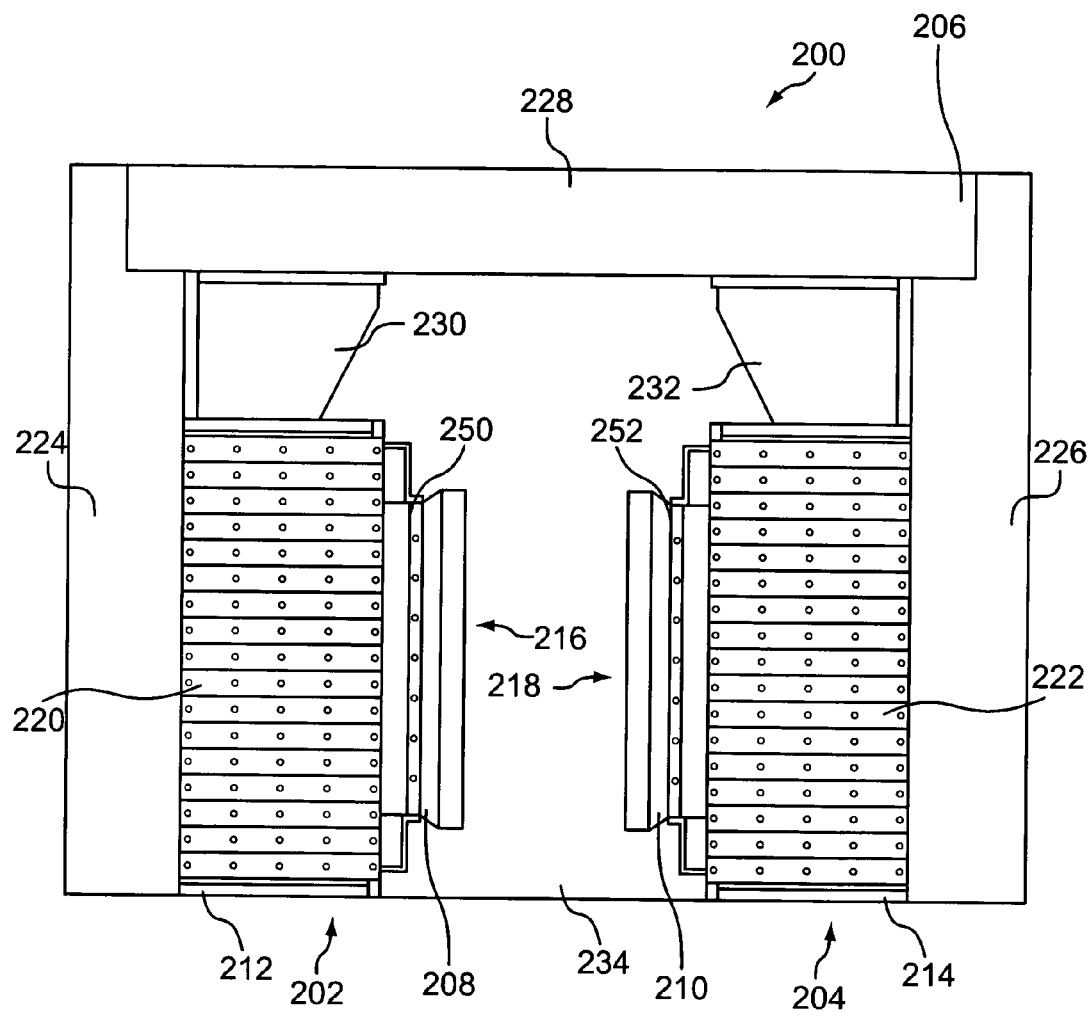
FIG. 8 is a top view of the embodiment shown in FIG. 7.

The first and second magnet assemblies 202, 204 include respective first and second poles 208, 210 and respective first and second magnet enclosures 212, 214. As shown in FIGS. 7 and 8, the poles 208, 210 are disposed on opposing sides of the magnet enclosures 212, 214, such that faces 216, 218 of the poles 208, 210 are substantially parallel and facing each other. The magnet enclosures 212, 214 are filled with magnetic material, which is the magnetic mass that provides the magneto-motive force of the permanent magnet. Each magnet enclosure 212, 214 has an opening through which the magnetic material can be placed into the magnet enclosure and taken out of the magnet enclosure. The magnetic material can take the form of, for example, discrete magnetic elements. These discrete magnetic elements can take any of various forms, such as that of bricks, that is, oblong rectangular shapes, or, as shown in the figures, thin, square, tile-shaped bricks. Alternatively, the discrete magnetic elements can be arcuately shaped, and stacked within the magnet enclosure to form a round magnetic mass. The interior of the magnet enclosures 212, 214 can be shaped to accommodate discrete magnetic elements of any shape. First and second covers 220, 222 are provided over the respective openings. The covers 220, 222 can be composed of discrete covering pieces, such as strips of material spanning the opening.

The magnetic material can be substantially composed of, for example, any of the rare earth metals, either alone or in any combination. The magnet enclosures 212, 214 are made from one or more magnetic materials, such as a ferromagnetic material. The poles 208, 210 are made from one or more magnetic materials, such as a ferromagnetic material. The covers 220, 222 are made from a sufficiently strong structural material that is not magnetic, such as aluminum.

The frame 206 includes first and second end plates 224, 226 connected to the respective magnet enclosures 212, 214, a first connecting element 228 joining first ends of the end plates 224, 226, and first and second support gussets 230, 232, acting as braces between the first connecting element 228 and the respective magnet enclosures 212, 214. The frame also includes a second connecting element 234 joining second ends of the end plates 224, 226. Structurally, the frame 206 keeps the magnet assemblies 202, 204 stationary and spaced at a selected distance. The structure of the frame 206 also maintains the relative orientation of the poles 208, 210, such that the pole faces 216, 218 are opposed and substantially parallel, as shown in FIGS. 7 and 8. Strictly in respect of the structural requirements of the frame 206, the end plates 224, 226, first and second connecting elements 228, 234, and support gussets 230, 232 are made of strong stiff material, such as metal. The support gussets 230, 232 preferably are made from a non-magnetic metal, such as aluminum. As in the previously-described embodiment, the gussets 230, 232 can include gusset platforms, to provide additional stability in bracing the magnet assemblies 202, 204. Whether the end plates 224, 226 and first and second connecting elements 228, 234 are made from a magnetic metal, and particularly from a ferromagnetic material, depends on the functionality required of these frame components, as described below.

Functionally, the end plates 224, 226 can act as flux collector plates. In such cases, the end plates 224, 226 are made from a magnetic material, preferably a ferromagnetic material, and a portion of each end plate 224, 226 facing the respective magnet enclosure 212, 214 is proximate to the magnetic material, and preferably is in contact with the magnetic material. This contact can be made either directly or through mutual contact with an interface element made of a magnetic material, such as a ferromagnetic material. Likewise, the connecting elements 228, 234 can function as flux returns between the flux connector plates. In such cases, the connecting elements 228, 234 are made from a magnetic material, preferably a ferromagnetic material. The addition of the second flux return enables the fabrication of both flux returns from smaller pieces of metal.

As shown, the magnet assemblies 202, 204 can also include respective first and second interface collectors 250, 252, disposed between the respective magnet enclosures 212, 214 and the respective poles 208, 210. The interface collectors 250, 252 are made of magnetic material, for example, ferromagnetic material, and provide a flux transmission interface between the magnetic material in the enclosures 212, 214 and the respective poles 208, 210. A first side of each interface collector faces the respective enclosure 212, 214, and can be in direct contact with the magnetic material within the enclosure. Alternatively, a space can be present between the interface collectors 250, 252 and the magnetic material, and an intervening material can be present within this space. A second side of each interface collector 250, 252 is in direct contact with the side of the respective pole 208, 210, that is facing the enclosure 212, 214. The geometry of each interface collector 250, 252 is such that the side facing the pole is substantially the same shape as the shape of the surface of the pole facing the interface collector. Likewise, the side of the interface collector facing the magnetic material in the enclosure has substantially the same shape as that of the facing surface of the magnetic material. Thus, for example, if the pole surface facing the interface collector is round, the surface of the interface collector facing the pole is also round. If the surface of the magnetic material facing the interface collector is square, the surface of the side of the interface collector facing the magnetic material is also square. Between its opposite faces, the cross-sectional shape of the interface collector undergoes a transition between the two face shapes, if necessary, to efficiently couple flux transfers between the magnetic material and the poles.

Figure 9:
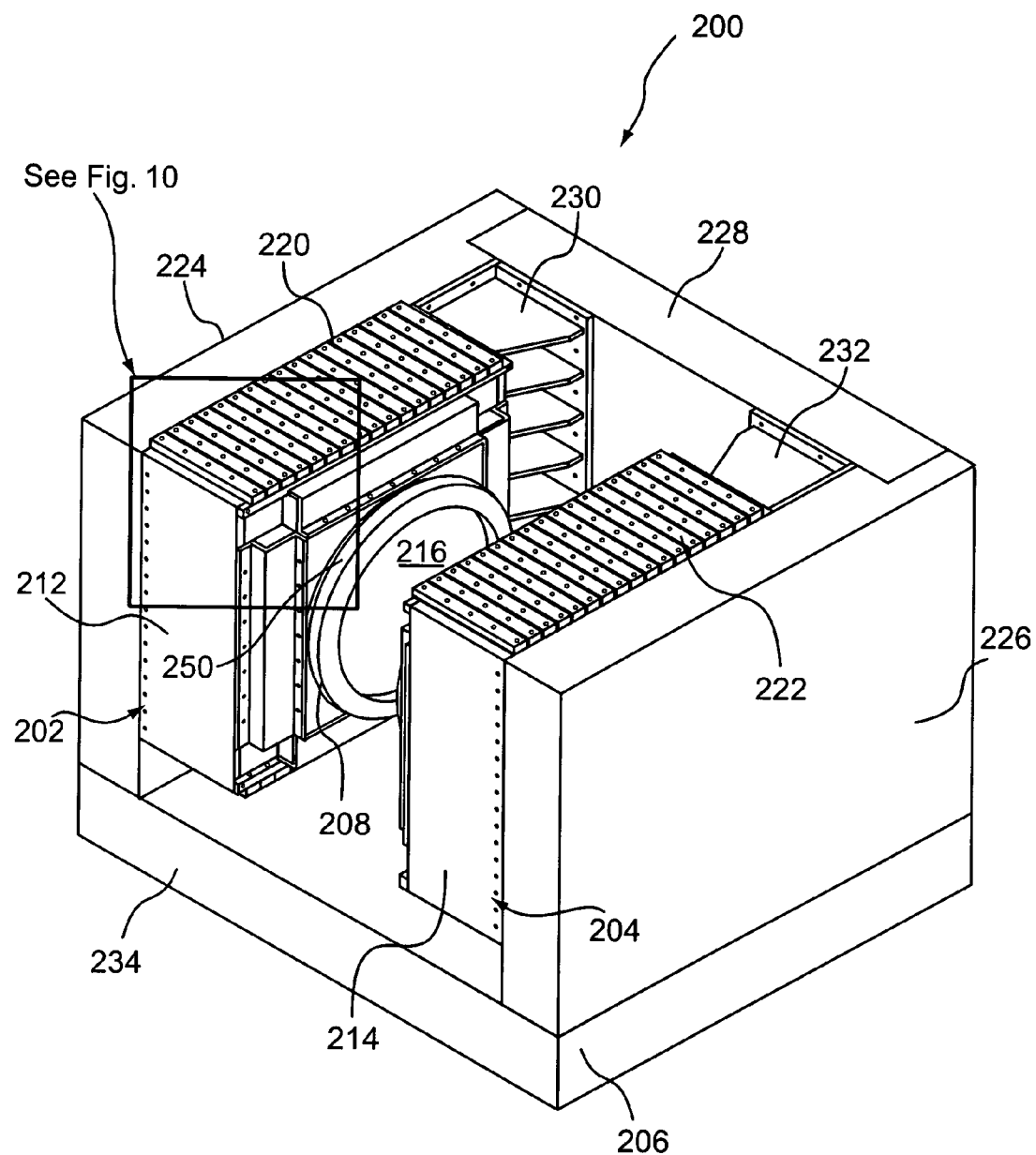
FIG. 9 is an isometric view of the embodiment shown in FIG. 7.
Figure 10:
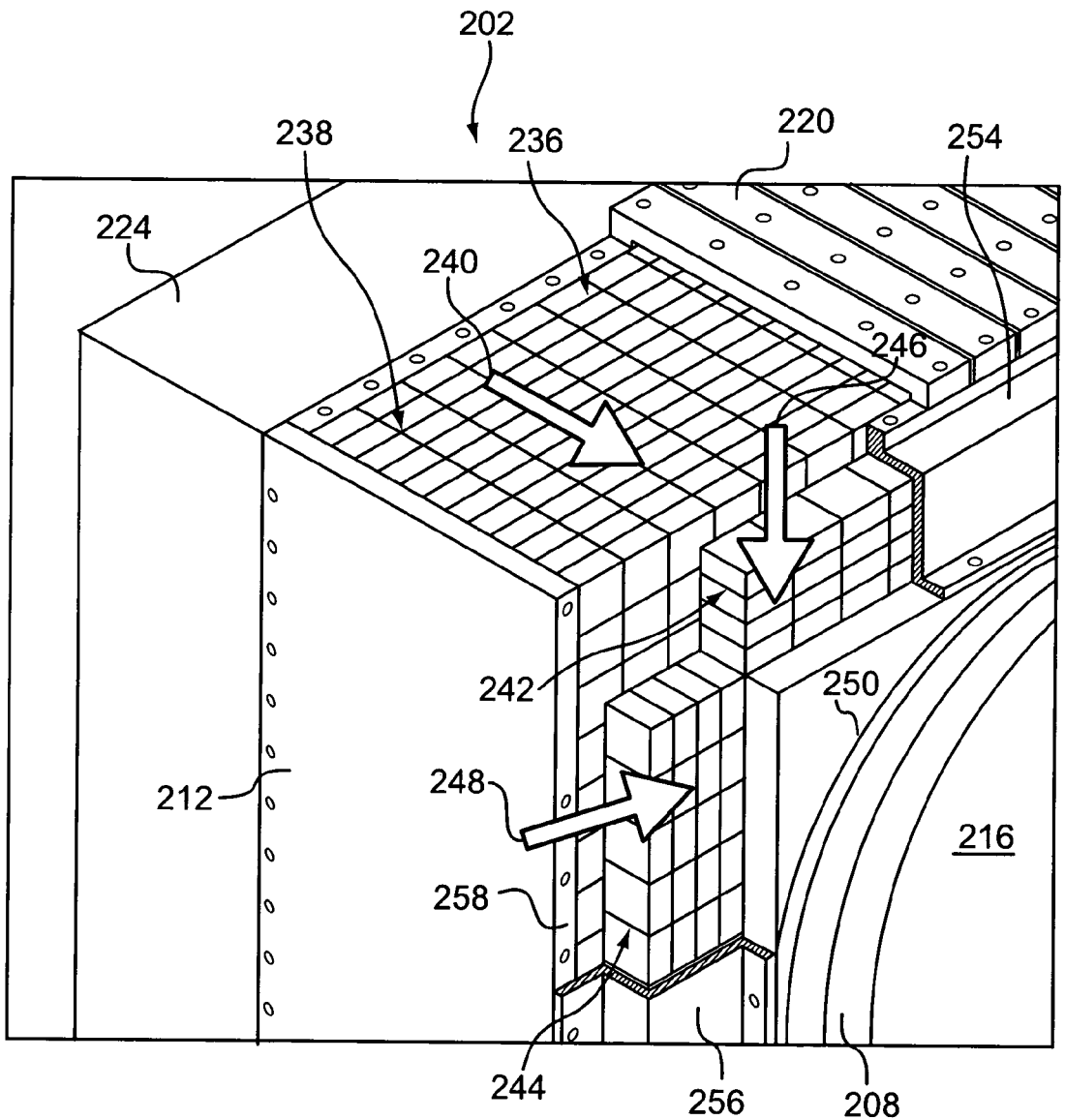
FIG. 10 is a detail view of a magnet brick array of the embodiment shown in FIG. 7.

FIG. 10 shows a detail of the structure shown in FIG. 9. In particular, FIG. 10 shows an exemplary embodiment in which the magnetic material takes the form of discrete magnetic elements in the shape of bricks 236, that is, thick, tile-shaped elements. The bricks 236 may be formed, for example, from a rare earth metal. A first array 238 of these bricks is stacked behind the pole 208, with the individual bricks oriented such that they each provide a field component that is generally aligned with field components provided by the other bricks in the array 238, to provide a generally directed, cumulative field. This array 238 constitutes a main stack of magnetic bricks, and provides the majority of the field for the magnet structure 200. The main array 238 of bricks provides a field having a main component pointed generally in the direction 240 of the pole 208. The field produced by the main array 238 is suitable for use in scanning subject tissue in the gap, but can be more effective if directed, or focused, toward a more distinct target area within the gap. Secondary bricks 242, 244 are provided for the purpose of directing the main field in this manner. For example, top blocking bricks 242 are arranged in front of the main array 238 and outside a periphery of the pole 208, on the same side of the magnet enclosure 212 as the opening and the cover 220. The top blocking bricks 242 are arranged in an array such that each top blocking brick contributes a field component in a direction 246 pointing away from the periphery of the pole 208 and toward a horizontal center line of the pole 208. Thus, the top blocking bricks 242 have the effect of directing the main field toward a specific location in the gap. In this example, that specific direction is toward a horizontal center line of the pole. An array of bottom blocking bricks can be disposed outside a bottom periphery of the pole 208, that is, on the side of the pole 208 opposite the side on which the top blocking bricks 242 are disposed. The overall effect of the bottom blocking bricks is to direct the main field produced by the main array 238 toward a horizontal center line of the pole 208, from the bottom side of the pole 208. If the bottom blocking bricks are used instead of the top blocking bricks 238, the effect would be a substantially similar one, albeit in mirror image. If the bottom blocking bricks are used in addition to the top blocking bricks 238, the resulting directed field will be more localized along the horizontal center line of the pole 208.

Likewise, side blocking bricks 244 can be arranged in front of the main array 238 and outside a periphery of the pole 208, adjacent the side of the magnet enclosure 212 having the opening and the cover 220. The side blocking bricks 244 are arranged in an array such that each side blocking brick contributes a field component in a direction 248 pointing away from the periphery of the pole 208 and toward a vertical center line of the pole 208. Thus, the side blocking bricks 244 have the effect of directing the main field toward a specific location in the gap. In this example, that specific direction is toward a vertical center line of the pole 208. An array of side blocking bricks can be disposed outside a periphery of the other side of the pole 208, that is, on the side of the pole 208 opposite the side on which the side blocking bricks 244 are disposed. The overall effect of these side blocking bricks is to direct the main field produced by the main array 238 toward a vertical center line of the pole 208, from the other side of the pole 208. If these second side blocking bricks are used instead of the first side blocking bricks 244, the effect would be a substantially similar one, albeit in mirror image. If the second side blocking bricks are used in addition to the first side blocking bricks 238, the resulting directed field will be more localized along the horizontal center line of the pole 208.

Likewise, blocking bricks can be disposed outside the periphery of the pole 208, on any combination of the top, bottom, and two sides of the pole 208. The locations and quantities of blocking bricks disposed at any of these locations can be selected to direct the main field to a desired volume within the magnet gap, effectively defining the working magnetic field volume. Defining the working volume in this manner makes more efficient use of the available field.

As shown in FIG. 10, the top blocking bricks 242 and side blocking bricks 244 are disposed around the periphery of the pole 208. In the exemplary embodiment shown, the blocking bricks are also disposed around the periphery of the interface collector 250, which is disposed against the main array 238 of magnetic bricks. Because this exemplary embodiment includes an interface collector 250 having surface dimensions that are smaller than the dimensions of the contact surface of the main array of bricks 236, open gaps are present between the interface collector 250 and the cover 220, and between the interface collector 250 and a sidewall 258 of the magnet enclosure 212. Brackets 254, 256 can be provided between the interface collector 250 and the cover 220 to close the top gap, and between the interface collector 250 and the sidewall 258 to cover the side gap. Further, because this exemplary embodiment includes both top blocking bricks 242 and side blocking bricks 244, the brackets 254, 256 can be shaped to restrain these bricks as well. Corresponding brackets can be located at the bottom periphery of the interface collector 250 and at the opposite side periphery of the interface collector 250, if necessary to close any gap that might exist, or to restrain any blocking bricks that might be used. The brackets 254, 256 are structural pieces, made from non-magnetic material, such as aluminum.

Third Exemplary Embodiment

Figure 11:
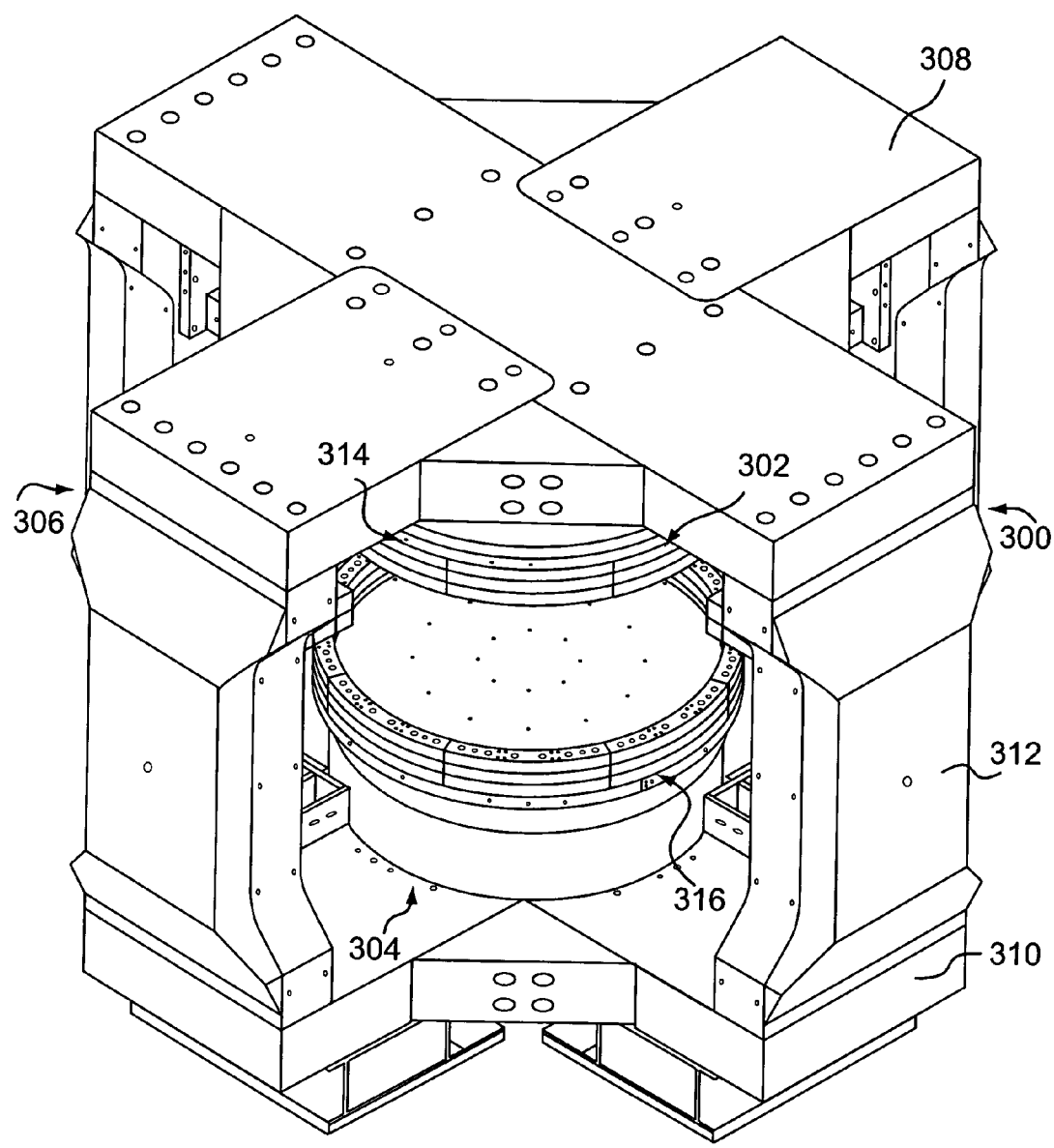
FIG. 11 is an isometric view of another embodiment of the magnet structure of the present invention.

A third exemplary embodiment of the present invention is shown in FIGS. 11-15. As shown in FIG. 11, the magnet structure 300 includes first and second opposing permanent magnet assemblies 302, 304, held in place and separated by a frame 306. The frame includes first and second frame ends 308, 310, to which the magnet assemblies 302, 304 are attached. The frame ends 308, 310 are separated by a number of spacers 312, which keep the opposing poles 314, 316 apart by a selected distance so as to form a gap therebetween that is suitable for the intended use of the magnet structure 300.

Figure 12:
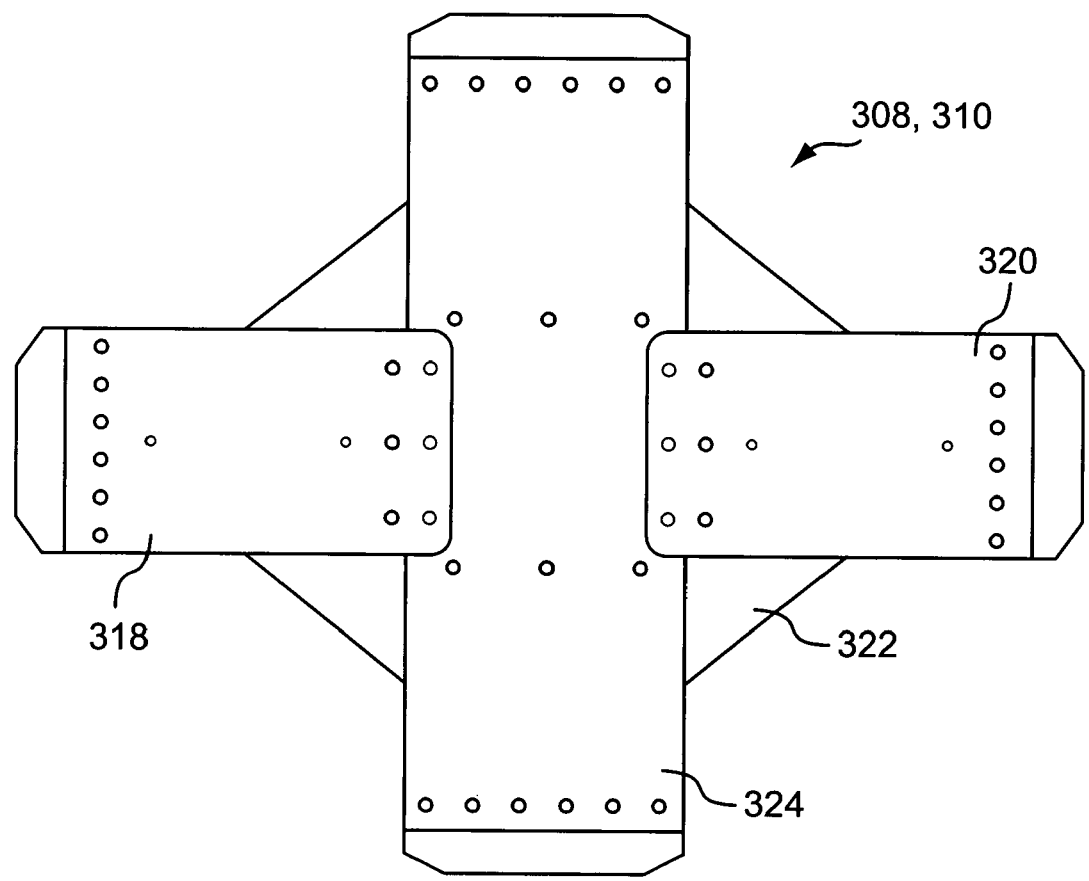
FIG. 12 is a top view of the embodiment shown in FIG. 11.

As shown in FIG. 12, each frame end 308, 310 is formed in the shape of a cross, that is, consisting of connected, transverse, or intersecting pieces forming a construction having four segments emanating from a common point, such that the segments are arranged at substantially right angles with respect to adjacent segments. Thus, the exemplary embodiment shown in FIGS. 11-14 utilizes frame ends having four extended segments. It is contemplated, however, that frame ends utilized as components of the present invention can have any number of extended segments. In the exemplary embodiment shown in FIG. 12, two smaller frame end pieces 318, 320 are connected to a larger frame end piece 324 to form the cross shape. The frame end 308, 310 structure can be reinforced by gussets 322 or other bracing construction.

Figure 13:
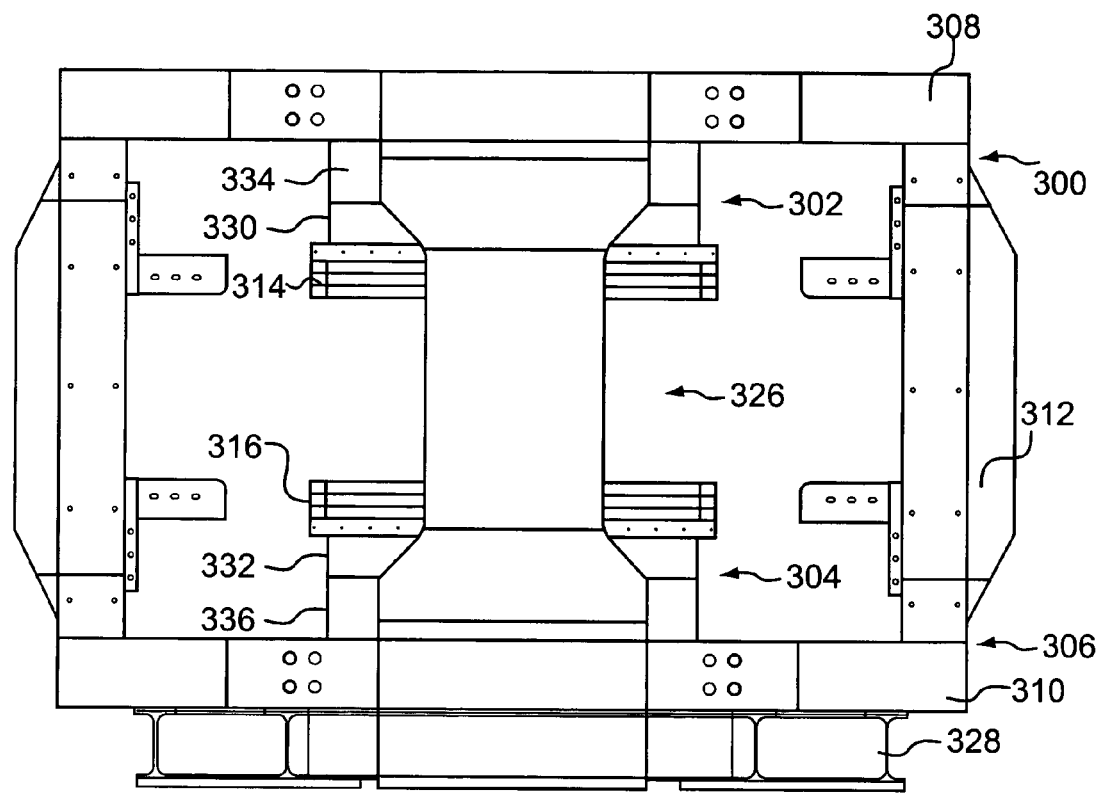
FIG. 13 is a side view of the embodiment shown in FIG. 11.

As shown in FIG. 13, the magnet structure 300 of the present invention can be arranged such that a first magnet assembly 302 is an upper magnet assembly, and a second magnet assembly 304 is a lower magnet assembly. Thus, according to this arrangement, the first and second frame ends 308, 310 are upper and lower frame ends, respectively. The spacers 312 rest on the lower frame end 310 and support the upper frame end 308. The length of the spacers 312 determines the distance between the upper pole 314 and the lower pole 316, defining the magnet gap 326 therebetween. A footer 328 can be used to raise the magnet structure 300 off the ground, and to isolate the lower frame end 310 from magnetic elements that might be present in the ground, which could affect the homogeneity of the field produced by the magnet structure 300.

The magnet assemblies 302, 304 each include a pole 314, 316, a collector 330, 332, and a permanent magnet insert 334, 336. The permanent magnet insert 334, 336 is the magnetic mass that provides the magneto-motive force for the magnet structure 300. The collector 330, 332 is positioned between the magnet insert 334, 336 and the pole 314, 316 to couple flux transfers between the magnetic material in the magnet insert 334, 336 and the pole 314, 316.

The frame ends 308, 310 can be made of magnetic material, for example, ferromagnetic material. In this case, the spacers 312 can also be made of magnetic material, for example, ferromagnetic material. When this construction is used, the spacers 312 satisfy a functional purpose in addition to a structural purpose. That is, the spacers 312 act as flux returns, so that the magnetic flux generated by the permanent magnet inserts 334, 336 can return with a minimum of reluctance.

Figure 15:
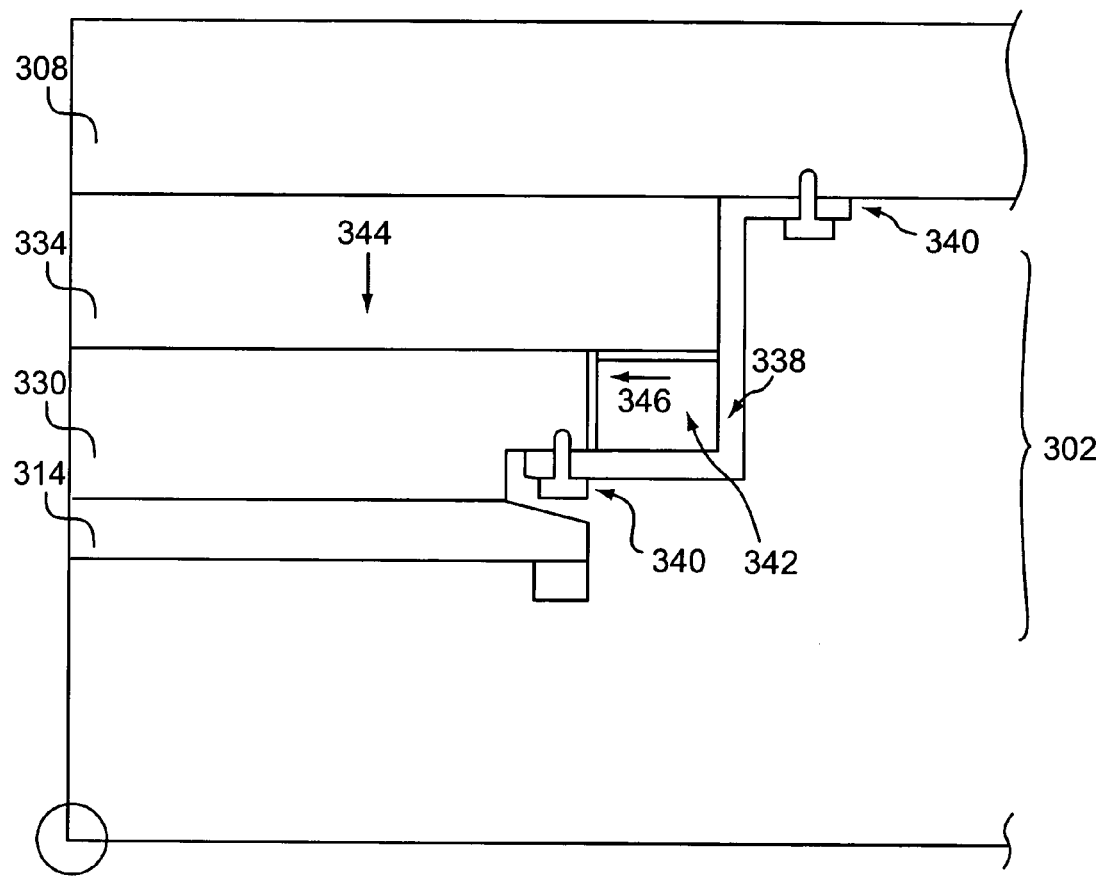
FIG. 15 is a cut-away sectional view of a detail of the embodiment shown in FIG. 11.

FIG. 15 shows a cross-section of the center portion of an upper right quadrant of the magnet structure 300. The following description applies to each quadrant of the magnet assembly 300, such that each quadrant has a corresponding mirror image symmetry of the structure described below. The upper end plate 308 is preferably fabricated from a ferromagnetic material, and provides the frame interface with the upper magnet assembly 302. The upper permanent magnet insert 334 is disposed below and in contact with the upper frame end 308. The permanent magnet insert 334 is a mass of ferromagnetic material composed of, for example, one or more rare earth metals. The collector plate 330 is disposed below and supports the permanent magnet insert 334. The collector plate 330 is held in place, for example, by attachment to the upper end plate 308. An exemplary attachment mechanism is shown in FIG. 15. A bracket 338 or other support is connected to both the upper frame end 308 and the collector plate 330, for example, by bolts 340. The bracket 338 is made from a non-magnetic structural material, such as aluminum. The pole 314 is attached to the collector plate 330.

The collector plate 330 is made of magnetic material, for example, ferromagnetic material, and provide a flux transmission interface between the permanent magnet insert 334 and the pole 314. A first side of the collector plate 330 faces the permanent magnet insert 334, and can be in direct contact with the magnetic material of the permanent magnet insert 334. Alternatively, a space can be present between the collector plate 330 and the magnetic material, and an intervening material can be present within this space. A second side of the collector plate 330 is in direct contact with the side of the pole 314 that is facing the permanent magnet insert 334. The geometry of the collector plate 330 is such that the side facing the pole 314 is substantially the same shape as the shape of the surface of the pole 314 facing the collector plate 330. Likewise, the side of the collector plate facing the permanent magnet insert 334 has substantially the same shape as that of the facing surface of the permanent magnet insert 334. Thus, for example, if the pole surface facing the collector plate 330 is round, the surface of the collector plate 330 facing the pole 314 is also round. If the surface of the permanent magnet insert 334 facing the collector plate 330 is square, the surface of the side of the collector plate 330 facing the permanent magnet insert 334 is also square. Between its opposite faces, the cross-sectional shape of the collector plate undergoes a transition between the two face shapes, if necessary, to efficiently couple flux transfers between the permanent magnet insert 334 and the pole 314. The collector plate 330 also provides a transition in size between the permanent magnet insert 334 and the pole 314, if necessary. Alternatively, the collector plate 330 is designed physically such that it matches with the permanent magnet insert 334, and a collector interface, preferably made of ferromagnetic material, is disposed between the collector plate 330 and the pole 314 to provide the geometric transition described above.

Figure 14:
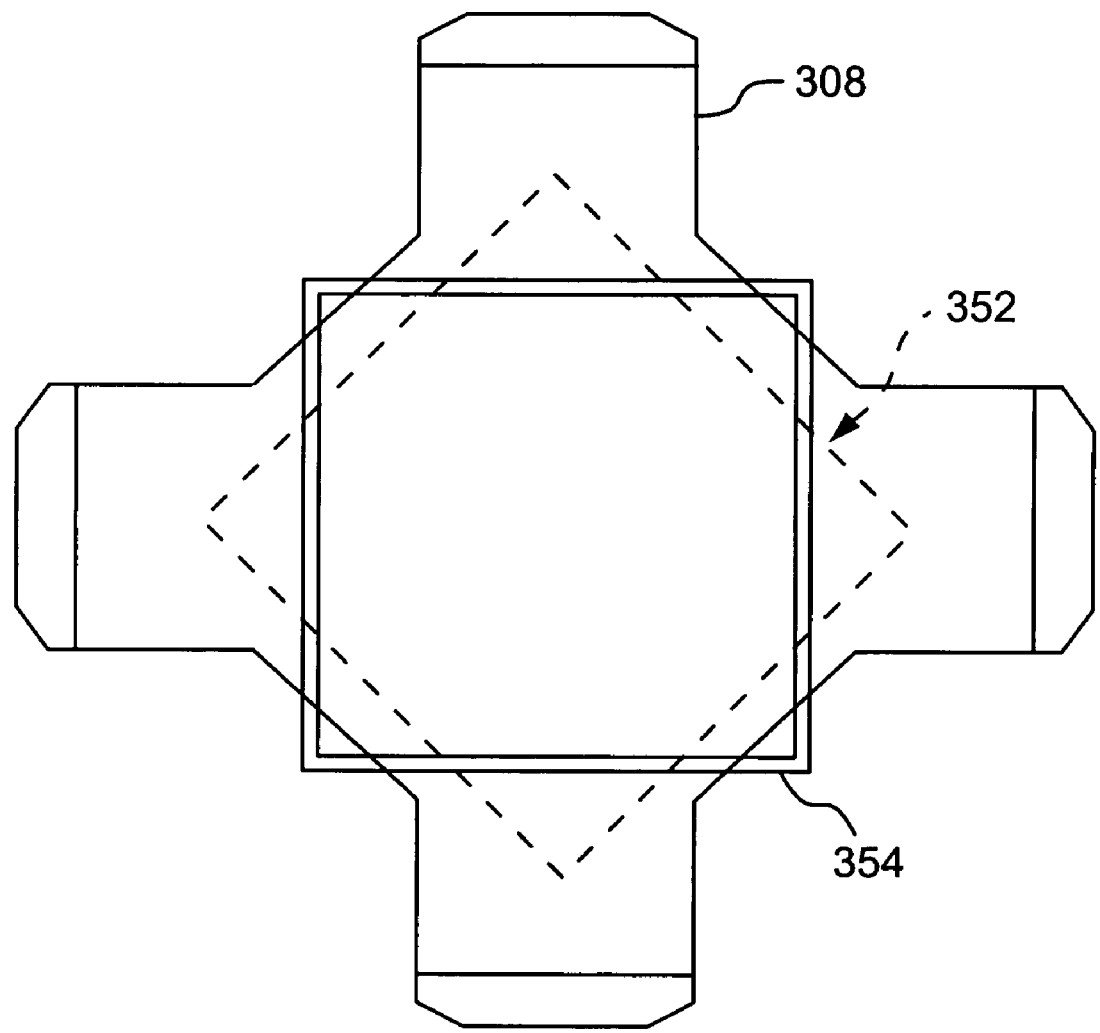
FIG. 14 is a top view of the embodiment shown in FIG. 11, showing alternative exemplary orientations of a magnet insert.

As described, the collector plate 330, upper frame end 308, and bracket 338 define a magnet enclosure in which the permanent magnet insert 334 is disposed. FIG. 14 is a top view of the upper frame end 308, with phantom views of two exemplary orientations of the magnet enclosure as described above. In this exemplary embodiment, the plan view of the magnet enclosure is rectangular, and in particular is substantially square. The shape and orientation of the collector plate 330, as well as the position and shape of the brackets 338, can result in a first orientation 352 of the magnet enclosure, such that the corners of the square shape of the magnet enclosure are disposed on the segments of the cross shape of the upper end plate 308. Alternatively, the position of the magnet enclosure can be rotated by 45 degrees, resulting in a second orientation 354 in which the sides of the square shape of the magnet enclosure are arranged in parallel with the segments of the cross shape of the upper end plate 308. The orientation of the lower magnet enclosure with respect to the lower end plate 310 is substantially the same as that of the upper magnet enclosure. It is contemplated that the magnet enclosure may assume any one of a variety of shapes and orientations. The shapes and orientations presented in FIG. 14, and this corresponding description, are illustrative only, to facilitate explanation.

The permanent magnet insert 334 itself can be any mass of magnetic material, such as the rare earth metal mentioned above. The magnetic material can take the form of, for example, discrete magnetic elements. These magnetic ele ments can take the form of arcuate elements, for example, arranged to form a polar permanent magnet insert 334. Alternatively, these elements can take the form of bricks, or three-dimensional rectangular, stackable elements. These bricks can be stacked within the magnet enclosure to form a magnet array that provides the magnetic field for the magnet structure 300.

As shown in FIG. 15, the permanent magnet insert 334 provides a field that is generally directed toward the pole 314. In the example where the permanent magnet insert 334 is composed of individual magnetic bricks, each brick is arranged such that it provides a field component in the general direction 344 of the pole 314, and the cumulative effect of the individual fields is a main field directed toward the pole 314. The field produced by the main array 334 is suitable for use in scanning subject tissue in the gap 326, but could be more effective if directed, or focused, toward a more distinct target area within the gap 326. A secondary permanent magnet insert 342, for example, composed of a second array of magnetic bricks, is provided for the purpose of directing the main field in this manner. For example, as shown, an array of blocking bricks 342 is arranged in front of the main array 334 (with respect to the pole 314) and outside a periphery of the pole 314. The blocking bricks 342 are arranged in an array such that each blocking brick contributes a field component in a direction 346 pointing away from the periphery of the pole 314 and toward a specific area of the pole 314. Thus, the top blocking bricks 342 have the effect of directing the main field toward a specific location in the gap. The quantities and locations of the blocking bricks 342 can be determined such that the overall effect of the secondary field direction 346 produced cumulatively by the individual blocking bricks directs the main field toward a specific location in the gap, that is, focusing the main field to a desired volume within the magnet gap, effectively defining the working magnetic field volume. Defining the working volume in this manner makes more efficient use of the available field.

The structure of the third exemplary embodiment can be constructed such that the magnet gap is approximately 22 inches to approximately 24 inches wide between the poles 314, 316. The magnetic material bricks 334 can be, for example, 2 inches wide by two inches long by one inch thick, and can be stacked within the magnet enclosure to create an array that is 46 inches square by six inches deep. The distance from the center of the gap to the bottom surface of the upper frame end, in that case, can be approximately 26 inches.

Particular exemplary embodiments of the present invention have been described in detail. These exemplary embodiments are illustrative of the inventive concept recited in the appended claims, and are not limiting of the scope or spirit of the present invention as contemplated by the inventors.

What is claimed is:

1. A magnet structure, comprising:
   a frame, including first and second opposing frame ends and a plurality of spacers separating the first and second frame ends;
   a first permanent magnet assembly, attached to the first frame end, including a first magnet enclosure, a first permanent magnet insert, and a first pole, having a first pole face and disposed on an end of the magnet enclosure; and
   a second permanent magnet assembly, attached to the second frame end, including a second magnet enclosure, a second permanent magnet insert, and a second pole, having a second pole face and disposed on an end of the second magnet enclosure;
   wherein each of the first and second frame ends is shaped substantially like a cross; and
   wherein the cross shape is supported by at least one gusset.

2. The magnet structure of claim 1, wherein the first and second permanent magnet inserts each include discrete magnetic elements.

3. The magnet structure of claim 2, wherein the discrete magnetic elements are made of magnetic material selected from group consisting of rare earth metals.

4. The magnet structure of claim 2, wherein the discrete magnetic elements have geometries that allow a magnetic field direction for each said discrete magnetic element to be selected based on a physical orientation of the discrete magnetic elements.

5. The magnet structure of claim 4, wherein the discrete magnetic elements are arranged so that a cumulative effect of individual field directions of the discrete magnetic elements is a magnetic field directed toward the respective pole face.

6. The magnet structure of claim 4, wherein the discrete magnetic elements include a first group of discrete magnetic elements arranged to have a magnetic field directed generally toward the respective pole face, and a second group of discrete magnetic elements focusing the magnetic field toward a particular area on the respective pole face.

7. The magnet structure of claim 6, wherein the particular area on the respective pole face is the center of the pole face.

8. The magnet structure of claim 6,
   wherein the second group of discrete magnetic elements is disposed between the first group of discrete magnetic elements and the respective pole face and outside an outer periphery of the respective pole face, and
   wherein the second group of discrete magnetic elements produces a magnetic field that has a direction substantially parallel to the pole face.

9. The magnet structure of claim 1, wherein the first and second permanent magnet inserts each include bricks made of magnetic material.

10. The magnet structure of claim 9, wherein the bricks are made of magnetic material selected from group consisting of rare earth metals.

11. The magnet structure of claim 9, wherein the bricks have geometries that allow a magnetic field direction for each said brick to be selected by physical arrangement of the brick.

12. The magnet structure of claim 11, wherein the bricks are arranged so that a cumulative effect of individual field directions of the bricks is a magnetic field directed toward the respective pole face.

13. The magnet structure of claim 11, wherein the bricks include a first group of bricks arranged to have a magnetic field directed generally toward the respective pole face, and a second group of bricks focusing the magnetic field toward a particular area on the respective pole face.

14. The magnet structure of claim 13, wherein the particular area on the respective pole face is an area including the center of the pole face.

15. The magnet structure of claim 13,
   wherein the second group of bricks is disposed between the first group of bricks and the respective pole face and outside an outer periphery of the respective pole face, and wherein the second group of bricks produces a magnetic field that has a direction substantially parallel to the pole face.

16. The magnet structure of claim 9, wherein dimensions of each said brick are approximately 2 inches by 2 inches by 1 inch.

17. The magnet structure of claim 9, wherein each said permanent magnet insert is an array of said bricks having dimensions of 46 inches by 46 inches by 6 inches.

18. The magnet structure of claim 9, wherein a distance between outside edges of the first and second frame ends is about 52 inches.

19. The magnet structure of claim 1, wherein a distance between the first and second pole faces is between about 22 inches and about 24 inches.

20. The magnet structure of claim 6, wherein the first and second groups of discrete magnetic elements together define a magnetic field volume.

21. A magnet structure, comprising:
a frame, including first and second opposing frame ends and a plurality of spacers separating the first and second frame ends;
a first permanent magnet assembly, attached to the first frame end, including a first magnet enclosure, a first permanent magnet insert, and a first pole, having a first pole face and disposed on an end of the first magnet enclosure; and
a second permanent magnet assembly, attached to the second frame end, including a second magnet enclosure, a second permanent magnet insert, and a second pole, having a second pole face and disposed on an end of the second magnet enclosure;
wherein each of the first and second frame ends is shaped substantially like a cross; and
wherein the spacers connect corresponding ends of the cross shapes of the first and second frame ends.

22. The magnet structure of claim 21, wherein the first and second permanent magnet inserts each include discrete magnetic elements.

23. The magnet structure of claim 22, wherein the discrete magnetic elements are made of magnetic material selected from group consisting of rare earth metals.

24. The magnetic structure of claim 22, wherein the discrete magnetic elements have geometries that allow a magnetic field direction for each said discrete magnetic element to be selected based on a physical orientation of the discrete magnetic elements.

25. The magnet structure of claim 24, wherein the discrete magnetic elements are arranged so that a cumulative effect of individual field directions of the discrete magnetic elements is a magnetic field directed toward the respective pole face.

26. The magnet structure of claim 24, wherein the discrete magnetic elements include a first group of discrete magnetic elements arranged to have a magnetic field directed generally toward the respective pole face, and a second group of discrete magnetic elements focusing the magnetic field toward a particular area on the respective pole face.

27. The magnet structure of claim 26, wherein the particular area on the respective pole face is the center of the pole face.

28. The magnet structure of claim 26,
wherein the second group of discrete magnetic elements is disposed between the first group of discrete magnetic elements and the respective pole face and outside an outer periphery of the respective pole face, and wherein the second group of discrete magnetic elements produces a magnetic field that has a discretion substantially parallel to the pole face.

29. The magnet structure of claim 26, wherein the first and second groups of discrete magnetic elements together define a magnetic field volume.

30. The magnetic structure of claim 21, wherein the first and second permanent magnet inserts each include bricks made of magnetic material.

31. The magnet structure of claim 30, wherein the bricks are made of magnetic material selected from group consisting of rare earth metals.

32. The magnet structure of claim 30, wherein the bricks have geometries that allow a magnetic field direction for each said brick to be selected by physical arrangement of the brick.

33. The magnet structure of claim 32, wherein the bricks are arranged so that a cumulative effect of individual field directions of the bricks is a magnetic field directed toward the respective pole face.

34. The magnet structure of claim 32, wherein the bricks include a first group of bricks arranged to have a magnetic field directed generally toward the respective pole face, and a second group of bricks focusing the magnetic field toward a particular area on the respective pole face.

35. The magnet structure of claim 34, wherein the particular area on the respective pole face is an area including the center of the pole face.

36. The magnet structure of claim 34,
wherein the second group of bricks is disposed between the first group of bricks and the respective pole face and outside an outer periphery of the respective pole face, and
wherein the second group of bricks produces a magnetic field that has a direction substantially parallel to the pole face.

37. The magnet structure of claim 30, wherein dimensions of each said brick are approximately 2 inches by 2 inches by 1 inch.

38. The magnet structure of claim 30, wherein each said permanent magnet insert is an array of said bricks having dimensions of 46 inches by 46 inches by 6 inches.

39. The magnet structure of claim 21, wherein a distance between outside edges of the first and second frame ends is about 52 inches.

40. The magnet structure of claim 21, wherein a distance between the first and second pole faces is between about 22 inches and about 24 inches.

41. A magnet structure, comprising:
a frame, including first and second opposing frame ends and a plurality of spacers separating the first and second frame ends;
a first permanent magnet assembly, attached to the first frame end, including a first magnet enclosure, a first permanent magnet insert, and a first pole, having a first pole face and disposed on an end of the first magnet enclosure; and
a second permanent magnet assembly, attached to the second frame end, including a second magnet enclosure, a second permanent magnet insert, and a second pole, having a second pole face and disposed on an end of the second magnet enclosure;
wherein the first and second magnet enclosures each include an open end, a closed end, and a sidewall, defining an inside space in which the respective permanent magnet insert is disposed;

wherein the first and second magnet enclosures are each attached to the respective frame end such that the open end is in direct communication with the respective frame end, and the respective pole is attached to the closed end; and wherein each said inside space has a plan view that is shaped substantially like a rectangle.

42. The magnet structure of claim 41, wherein the first and second frame ends are each shaped substantially like a cross, and the sides of each of the inside spaces are substantially parallel with arms of the respective cross.

43. The magnet structure of claim 41, wherein the first and second frame ends are each shaped substantially like a cross, and the corners of each of the inside spaces are disposed on arms of the respective cross.

44. The magnet structure of claim 41, wherein the first and second permanent magnet inserts each include discrete magnetic elements.

45. The magnet structure of claim 44, wherein the discrete magnetic elements are made of magnetic material selected from group consisting of rare earth metals.

46. The magnet structure of claim 44, wherein the discrete magnetic elements have geometries that allow a magnetic field direction for each said discrete magnetic element to be selected based on a physical orientation of the discrete magnetic elements.

47. The magnetic structure of claim 46, wherein the discrete magnetic elements are arranged so that a cumulative effect of individual field directions of the discrete magnetic elements is a magnetic field directed toward the respective pole face.

48. The magnet structure of claim 46, wherein the discrete magnetic elements include a first group of discrete magnetic elements arranged to have a magnetic field directed generally toward the respective pole face, and a second group of discrete magnetic elements focusing the magnetic field toward a particular area on the respective pole face.

49. The magnet structure of claim 48, wherein the particular area on the respective pole face is the center of the pole face.

50. The magnet structure of claim 48,
wherein the second group of discrete magnetic element is disposed between the first group of discrete magnetic elements and the respective pole face and outside an outer periphery of the respective pole face, and wherein the second group of discrete magnetic elements produces a magnetic field that has a direction substantially parallel to the pole face.

51. The magnet structure of claim 48, wherein the first and second groups of discrete magnetic elements together define a magnetic field volume.

52. The magnet structure of claim 41, wherein the first and second permanent magnet inserts each include bricks made of magnetic material.

53. The magnet structure of claim 52, wherein the bricks are made of magnetic material selected from group consisting of rare earth metals.

54. The magnet structure of claim 52, wherein the bricks have geometries that allow a magnetic field direction for each said brick to be selected by physical arrangement of the brick.

55. The magnet structure of claim 54, wherein the bricks are arranged so that a cumulative effect of individual field directions of the bricks is a magnetic field directed toward the respective pole face.

56. The magnet structure of claim 54, wherein the bricks include a first group of bricks arranged to have a magnetic field directed generally toward the respective pole face, and a second group of bricks focusing the magnetic field toward a particular area on the respective pole face.

57. The magnet structure of claim 56, wherein the particular area on the respective pole face is an area including the center of the pole face.

58. The magnet structure of claim 56,
wherein the second group of bricks is disposed between the first group of bricks and the respective pole face and outside an outer periphery of the respective pole face, and wherein the second group of bricks produces a magnetic field that has a direction substantially parallel to the pole face.

59. The magnet structure of claim 52, wherein dimensions of each said brick are approximately 2 inches by 2 inches by 1 inch.

60. The magnet structure of claim 52, wherein each said permanent magnet insert is an array of said bricks having dimensions of 46 inches by 46 inches by 6 inches.

61. The magnet structure of claim 41, wherein a distance between outside edges of the first and second frame ends is about 52 inches.

62. The magnet structure of claim 41, wherein a distance between the first and second pole faces is between about 22 inches and about 24 inches.

63. A magnet structure, comprising:
a frame, including first and second opposing frame ends and a plurality of spacers scraping the first and second frame ends;

a first permanent magnet assembly, attached to the first frame end, including a first magnet enclosure, a first permanent magnet insert, and a first pole, having a first pole face and disposed on an end of the first magnet enclosure; and a second permanent magnet assembly, attached to the second frame end, including a second magnet enclosure, a second permanent magnet insert, and a second pole, having a second pole face and disposed on an end of the second magnet enclosure;

wherein the first and second magnet enclosures each include an open end, a closed end, and a sidewall, defining an inside space in which the respective permanent magnet insert is disposed;

wherein the first and second magnet enclosures are each attached to the respective frame end such that the open end is in the direct communication with the respective frame end, and the respective pole is attached to the closed end; and wherein the first and second magnet enclosures are made substantially of iron.

64. A magnet structure, comprising:
a frame, including first and second opposing frame ends and a plurality of spacers separating the first and second frame ends;

a first permanent magnet assembly, attached to the first frame end, including a first magnet enclosure, a first permanent magnet insert, and a first pole, having a first pole face and disposed on an end of the first magnet enclosure; and a second permanent magnet assembly, attached to the second frame end, including a second magnet enclosure, a second permanent magnet insert, and a second pole, having a second pole face and disposed on an end of the second magnet enclosure;

wherein each of the first and second magnet enclosures includes a retainer, and a support attaching the retainer to the respective frame end, such that the respective permanent magnet insert is held between a first side of the retainer and the respective frame end, and the respective pole is connected to a second side of the retainer; and wherein each said support is made of a non-magnetic material.

65. The magnet structure of claim 64, wherein each said support is made of aluminum.

66. The magnet structure of claim 64, wherein the first and second permanent magnet inserts each include discrete magnetic elements.

67. The magnet structure of claim 66, wherein the discrete magnetic elements are made of magnetic material selected from group consisting of rare earth metals.

68. The magnet structure of claim 66, wherein the discrete magnetic elements have geometries that allow a magnetic field direction for each said discrete magnetic element to be selected based on a physical orientation of the discrete magnetic elements.

69. The magnet structure of claim 68, wherein the discrete magnetic elements are arranged so that a cumulative effect of individual field directions of the discrete magnetic elements is a magnetic field directed toward the respective pole face.

70. The magnet structure of claim 68, wherein the discrete magnetic elements include a first group of discrete magnetic elements arranged to have a magnetic field directed generally toward the respective pole face, and a second group of discrete magnetic elements focusing the magnetic field toward a particular area on the respective pole face.

71. The magnet structure of claim 70, wherein the particular area on the respective pole face is the center of the pole face.

72. The magnet structure of claim 70,
wherein the second group of discrete magnetic elements is disposed between the first group of discrete magnetic elements and the representative pole face and outside an outer periphery of the respective pole face; and
wherein the second group of discrete magnetic elements produces a magnetic field that has a direction substantially parallel to the pole face.

73. The magnet structure of claim 70, wherein the first and second groups of discrete magnetic elements together define a magnetic field volume.

74. The magnet structure of claim 64, wherein the first and second permanent magnet inserts each include bricks made of magnetic material.

75. The magnet structure of claim 74, wherein the bricks are made of magnetic material selected from a group consisting of rare earth metals.

76. The magnet structure of claim 74, wherein the bricks have geometries that allow a magnetic field direction for each said brick to be selected by physical arrangement of the brick.

77. The magnet structure of claim 76, wherein the bricks are arranged so that a cumulative effect of individual field directions of the bricks is a magnetic field directed toward the respective pole face.

78. The magnet structure of claim 76, wherein the bricks include a first group of bricks arranged to have a magnetic field directed generally toward the respective pole face, and a second group of bricks focusing the magnetic field toward a particular area on the respective pole face.

79. The magnet structure of claim 78, wherein the particular area on the respective pole face is an area including the center of the pole face.

80. The magnet structure of claim 78,
wherein the second group of bricks is disposed between the first group of bricks and the respective pole face and outside an outer periphery of the respective pole face, and
wherein the second group of bricks produces a magnetic field that has a direction substantially parallel to the pole face.

81. The magnet structure of claim 74, wherein dimensions of each said brick are approximately 2 inches by 2 inches by 1 inch.

82. The magnet structure of claim 74, wherein each said permanent magnet insert is an array of said bricks having dimensions of 46 inches by 46 inches by 6 inches.

83. The magnet structure of claim 64, wherein a distance between outside edges of the first and second frame ends is about 52 inches.

84. The magnet structure of claim 64, wherein a distance between the first and second pole faces is between about 22 inches and about 24 inches.

85. A magnet structure, comprising:
a frame, including first and second opposing frame ends and a plurality of spacers separating the first and second frame ends;
a first permanent magnet assembly, attached to the first frame end, including a first magnet enclosure, a first permanent magnet insert, and a first pole, having a first pole face and disposed on an end of the first magnet enclosure; and
a second permanent magnet assembly, attached to the second frame end, including a second magnet enclosure, a second permanent magnet insert, and a second pole, having a second pole face and disposed on an end of the second magnet enclosure;
wherein each of the first and second magnet enclosures includes a retainer, and a support attaching the retainers to the respective frame end, such that the respective permanent magnet insert is held between a first side of the retainer and the respective frame end, and the respective pole is connected to a second side of the retainer; and
wherein each said retainer is made substantially of iron; and
wherein each said retainer includes a first face disposed in contact with the respective permanent magnet insert, and a second face disposed in contact with the respective pole.

86. The magnet structure of claim 85, wherein each said retainer is a flux transmission interface between the respective permanent magnet insert and the respective pole.

87. The magnet structure of claim 85, wherein the second face of each said retainer has a first shape that matches a shape of a contact surface of the respective pole.

88. The magnet structure of claim 87, wherein the first face of each said retainer has a second shape that matches a shape of a contact surface of the respective permanent magnet insert.

89. The magnet structure of claim 88, wherein a cross-sectional shape of each said retainer changes in transition from the first shape to the second shape along a thickness of the respective retainer.

90. The magnet structure of claim 89, wherein the transition is smooth.

91. The magnet structure of claim 85, wherein the first and second permanent magnet inserts each include discrete magnetic elements.

92. The magnet structure of claim 91, wherein the discrete magnetic elements are made of magnetic material selected from group consisting of rare earth metals.

93. The magnet structure of claim 91, wherein the discrete magnetic elements have geometries that allow a magnetic field direction for each said discrete magnetic element to be selected based on a physical orientation of the discrete magnetic elements.

94. The magnet structure of claim 93, wherein the discrete magnetic elements are arranged so that a cumulative effect of individual field directions of the discrete magnetic elements is a magnetic field directed toward the respective pole face.

95. The magnet structure of claim 93, wherein the discrete magnetic elements include a first group of discrete magnetic elements arranged to have a magnetic field directed generally toward the respective pole face, and a second group of discrete magnetic elements focusing the magnetic field toward a particular area on the respective pole face.

96. The magnet structure of claim 95, wherein the particular area on the respective pole face is the center of the pole face.

97. The magnet structure of claim 95,
wherein the second group of discrete magnetic elements is disposed between the first group of discrete magnetic elements and the respective pole face and outside an outer periphery of the respective pole face; and
wherein the second group of discrete magnetic elements produces a magnetic field that has a direction substantially parallel to the pole face.

98. The magnet structure of claim 95, wherein the first and second groups of discrete magnetic elements together define a magnetic field volume.

99. The magnet structure of claim 85, wherein the first and second permanent magnet inserts each include bricks made of magnetic material.

100. The magnet structure of claim 99, wherein the bricks are made of magnetic material selected from group consisting of rare earth metals.

101. The magnet structure of claim 99, wherein the bricks have geometries that allow a magnetic field direction for each said brick to be selected by physical arrangement of the brick.

102. The magnet structure of claim 101, wherein the bricks are arranged so that a cumulative effect of individual field directions of the bricks is a magnetic field directed toward the respective pole face.

103. The magnet structure of claim 101, wherein the bricks include a first group of bricks arranged to have a magnetic field directed generally toward the respective pole face, and a second group of bricks focusing the magnetic field toward a particular area on the respective pole face.

104. The magnet structure of claim 103, wherein the particular area on the respective pole face is an area including the center of the pole face.

105. The magnet structure of claim 103,
wherein the second group of bricks is disposed between the first group of bricks and the respective pole face and outside an outer periphery of the respective pole face, and
wherein the second group of bricks produces a magnetic field that has a direction substantially parallel to the pole face.

106. The magnet structure of claim 99, wherein dimensions of each said brick are approximately 2 inches by 2 inches by 1 inch.

107. The structure of claim 99, wherein each said permanent magnet insert is an array of said bricks having dimensions of 46 inches by 46 inches by 6 inches.

108. The magnet structure of claim 85, wherein a distance between outside edges of the first and second frame ends is about 52 inches.

109. The magnet structure of claim 85, wherein a distance between the first and second pole faces is between about 22 inches and about 24 inches.

110. A magnet structure, comprising:
a frame, including first and second opposing frame ends and a plurality of spacers separating the first and second frame ends;
a first permanent magnet assembly, attached to the first frame end, including a first magnet enclosure, a first permanent magnet insert, and a first pole, having a first pole face and disposed on an end of the first magnet enclosure; and
a second permanent magnet assembly, attached to the second frame end, including a second magnet enclosure, a second permanent magnet insert, and a second pole, having a second pole face and disposed on an end of the second magnet enclosure;
wherein the first and second frame ends are made substantially of iron; and
wherein the plurality of spacers are made of a magnetic material.

111. The magnet structure of claim 110, wherein the spacers are flux returns.

112. The magnet structure of claim 110, wherein the first and second permanent magnet inserts each include discrete magnetic elements.

113. The magnet structure of claim 112, wherein the discrete magnetic elements are made of magnetic material selected from group consisting of rare earth metals.

114. The magnet structure of claim 112, wherein the discrete magnetic elements have geometries that allow a magnetic field direction for each said discrete magnetic element to be selected based on a physical orientation of the discrete magnetic elements.

115. The magnet structure of claim 114, wherein the discrete magnetic elements include a first group of discrete magnetic elements arranged to have a magnetic field directed generally toward the respective pole face, and a second group of discrete magnetic elements focusing the magnetic field toward a particular area on the respective pole face.

116. The magnet structure of claim 115, wherein the particular area on the respective pole face is the center of the pole face.

117. The magnet structure of claim 115,
wherein the second group of discrete magnetic elements is disposed between the first group of discrete magnetic elements and the respective pole face and outside an outer periphery of the respective pole face, and
wherein the second group of discrete magnetic elements produces a magnetic field that has a direction substantially parallel to the pole face.

118. The magnet structure of claim 115, wherein the first and second groups of discrete magnetic elements together define a magnetic field volume.

119. The magnet structure of claim 110, wherein the first and second permanent magnet inserts each include bricks made of magnetic material.

120. The magnet structure of claim 119, wherein the bricks are made of magnetic material selected from group consisting of rare earth metals.

121. The magnet structure of claim 119, wherein the bricks have geometries that allow a magnetic field direction for each said brick to be selected by physical arrangement of the brick.

122. The magnet structure of claim 121, wherein the bricks are arranged so that a cumulative effect of individual directions of the bricks is a magnetic field directed toward the representative pole face.

123. The magnet structure of claim 121, wherein the bricks include a first group of bricks arranged to have a magnetic field directed generally toward the respective pole face, and a second group of bricks focusing the magnetic field toward a particular area on the respective pole face.

124. The magnet structure of claim 123, wherein the particular area on the respective pole face is an area including the center of the pole face.

125. The magnet structure of claim 123,
wherein the second group of bricks is disposed between the first group of bricks and the respective pole face and outside an outer periphery of the respective pole face, and
wherein the second group or bricks produces a magnetic field that has a direction substantially parallel to the pole face.

126. The magnet structure of claim 119, wherein dimensions of each said brick are approximately 2 inches by 2 inches by 1 inch.

127. The magnet structure of claim 119, wherein each said permanent magnet insert is an array of said bricks having dimensions of 46 inches by 46 inches by 6 inches.

128. The magnet structure of claim 110, wherein a distance between outside edges of the first and second frame ends in about 52 inches.

129. The magnet structure of claim 110, wherein a distance between the first and second pole faces is between about 22 inches and about 24 inches.

130. The magnet structure of claim 114, wherein the discrete magnetic elements are arranged so that a cumulative effect of individual field directions of the discrete magnetic elements is a magnetic field directed toward the respective pole face.

* * * * *